US007057231B2

(12) United States Patent
Ding et al.

(10) Patent No.: US 7,057,231 B2
(45) Date of Patent: Jun. 6, 2006

(54) NONVOLATILE MEMORY CELL WITH A FLOATING GATE AT LEAST PARTIALLY LOCATED IN A TRENCH IN A SEMICONDUCTOR SUBSTRATE

(75) Inventors: Yi Ding, Sunnyvale, CA (US); Vei-Han Chan, San Jose, CA (US)

(73) Assignee: ProMOS Technologies, Inc., Hsin-Chu (TW)

( * ) Notice: Subject to any disclaimer, the term of this patent is extended or adjusted under 35 U.S.C. 154(b) by 0 days.

(21) Appl. No.: 10/847,850

(22) Filed: May 17, 2004

(65) Prior Publication Data

US 2004/0207006 A1 Oct. 21, 2004

Related U.S. Application Data

(62) Division of application No. 10/252,143, filed on Sep. 19, 2002.

(51) Int. Cl.
*H01L 21/8238* (2006.01)
(52) U.S. Cl. .................. 257/315; 257/317; 257/318; 257/401
(58) Field of Classification Search ................ 257/411, 257/315, 318

See application file for complete search history.

(56) References Cited

U.S. PATENT DOCUMENTS

| | | |
|---|---|---|
| 4,571,513 A | 2/1986 | Lade et al. |
| 4,763,181 A | 8/1988 | Tasch |
| 4,890,144 A | 12/1989 | Teng et al. |

(Continued)

FOREIGN PATENT DOCUMENTS

GB  2199695  7/1998

(Continued)

OTHER PUBLICATIONS

Pein, Howard B. and Plummer, James D., "Performance of the 3-D Sidewall Flash EPROM Cell", Electron Devices Society of IEEE, Washington, DC, Dec. 5-8, 1993, pp. 2.1.1-2.1.4.

(Continued)

*Primary Examiner*—Nathan J. Flynn
*Assistant Examiner*—Ahmed N. Sefer
(74) *Attorney, Agent, or Firm*—Michael Shenker; MacPherson Kwok Chen & Heid LLP

(57) ABSTRACT

A floating gate (110) of a nonvolatile memory cell is formed in a trench (114) in a semiconductor substrate (220). A dielectric (128) covers the surface of the trench. The wordline (140) has a portion overlying the trench. The cell's floating gate transistor has a first source/drain region (226), a channel region (224), and a second source/drain region (130). The dielectric (128) is stronger against leakage near at least a portion of the first source/drain region (122) than near at least a portion of the channel region. The stronger portion (128.1) of the additional dielectric improves data retention without increasing the programming and erase times if the programming and erase operations do not rely on a current through the stronger portion. Additional dielectric (210) has a portion located below the top surface of the substrate between the trench and a top part of the second source/drain region (130). The second source/drain region has a part located below the additional dielectric and meeting the trench. The additional dielectric can be formed with shallow trench isolation technology. The additional dielectric reduces the capacitance between the second source/drain region (130) and the floating gate.

29 Claims, 20 Drawing Sheets

U.S. PATENT DOCUMENTS

| | | | |
|---|---|---|---|
| 4,941,026 A * | 7/1990 | Temple | 257/333 |
| 4,964,080 A | 10/1990 | Tzeng | |
| 5,016,067 A | 5/1991 | Mori | |
| 5,141,886 A | 8/1992 | Mori | |
| 5,242,845 A * | 9/1993 | Baba et al. | 438/243 |
| 5,250,458 A | 10/1993 | Tsukamoto et al. | 437/52 |
| 5,250,829 A | 10/1993 | Bronner et al. | 257/301 |
| 5,264,716 A | 11/1993 | Kenney | 257/301 |
| 5,336,629 A | 8/1994 | Dhong et al. | 437/52 |
| 5,675,161 A | 10/1997 | Thomas | 257/316 |
| 5,837,554 A | 11/1998 | Contiero et al. | |
| 5,869,858 A * | 2/1999 | Ozawa et al. | 257/296 |
| 5,895,255 A | 4/1999 | Tsuchiaki | 438/427 |
| 5,932,908 A * | 8/1999 | Noble | 257/315 |
| 5,960,284 A | 9/1999 | Lin et al. | 438/259 |
| 5,970,341 A | 10/1999 | Lin et al. | 438/257 |
| 5,998,821 A | 12/1999 | Hieda et al. | 257/301 |
| 6,001,687 A | 12/1999 | Chu et al. | 438/257 |
| 6,011,288 A | 1/2000 | Lin et al. | 257/321 |
| 6,048,765 A | 4/2000 | Wu | 438/257 |
| 6,066,869 A | 5/2000 | Noble et al. | 257/296 |
| 6,078,076 A | 6/2000 | Lin et al. | 257/321 |
| 6,084,265 A | 7/2000 | Wu | 257/332 |
| 6,087,222 A | 7/2000 | Jung Lin et al. | 438/259 |
| 6,100,130 A | 8/2000 | Iba et al. | 438/243 |
| 6,100,132 A | 8/2000 | Sato et al. | 438/243 |
| 6,127,226 A | 10/2000 | Lin et al. | 438/259 |
| 6,151,248 A | 11/2000 | Harari et al. | 365/185.14 |
| 6,153,494 A | 11/2000 | Hsieh et al. | 438/424 |
| 6,165,845 A | 12/2000 | Hsieh et al. | 438/260 |
| 6,204,126 B1 | 3/2001 | Hsieh et al. | 438/267 |
| 6,207,992 B1 | 3/2001 | Mori | |
| 6,249,022 B1 | 6/2001 | Lin et al. | 257/324 |
| 6,255,682 B1 * | 7/2001 | Wu | 257/301 |
| 6,271,561 B1 * | 8/2001 | Doan | 257/316 |
| 6,312,982 B1 | 11/2001 | Takato et al. | |
| 6,344,993 B1 | 2/2002 | Harari et al. | 365/185.01 |
| 6,355,524 B1 | 3/2002 | Tuan et al. | 438/257 |
| 6,380,035 B1 | 4/2002 | Sung et al. | 438/264 |
| 6,380,583 B1 | 4/2002 | Hsieh et al. | 257/314 |
| 6,410,389 B1 | 6/2002 | Cappelletti et al. | 438/257 |
| 6,410,391 B1 * | 6/2002 | Zelsacher | 438/259 |
| 6,451,654 B1 * | 9/2002 | Lin et al. | 438/266 |
| 6,501,117 B1 * | 12/2002 | Radens et al. | 257/301 |
| 6,734,485 B1 | 5/2004 | Wu | |
| 6,744,097 B1 * | 6/2004 | Yoo | 257/321 |
| 6,902,982 B1 * | 6/2005 | Chen | 438/392 |
| 2002/0012745 A1 | 1/2002 | Kanamori | 427/96 |
| 2002/0024081 A1 * | 2/2002 | Gratz | 257/301 |

FOREIGN PATENT DOCUMENTS

| | | | |
|---|---|---|---|
| JP | 61-229339 | * | 10/1986 |
| JP | 2002-26147 | | 1/2002 |
| JP | 2002-76153 | | 3/2002 |
| JP | 2003-100918 | * | 4/2003 |
| WO | 00/74139 A1 | | 12/2000 |

OTHER PUBLICATIONS

Kuo, Di-Son et al., "TEFET—A High Density, Low Erase Voltage, Trench Flash EEPROM", 1994 Symposium on VLSI Technology Digest of Technical Papers, 1994 IEEE, pp. 51-52.

* cited by examiner

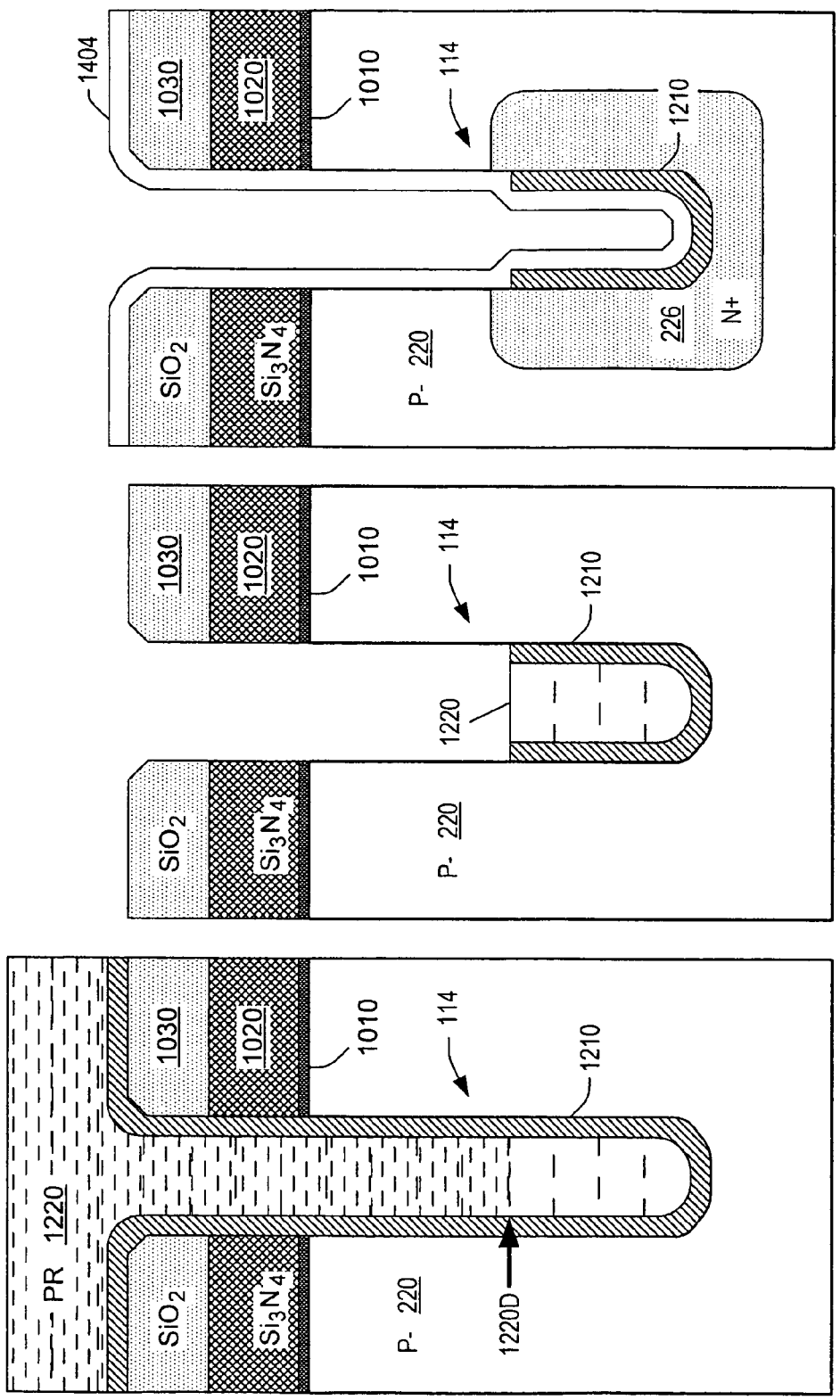

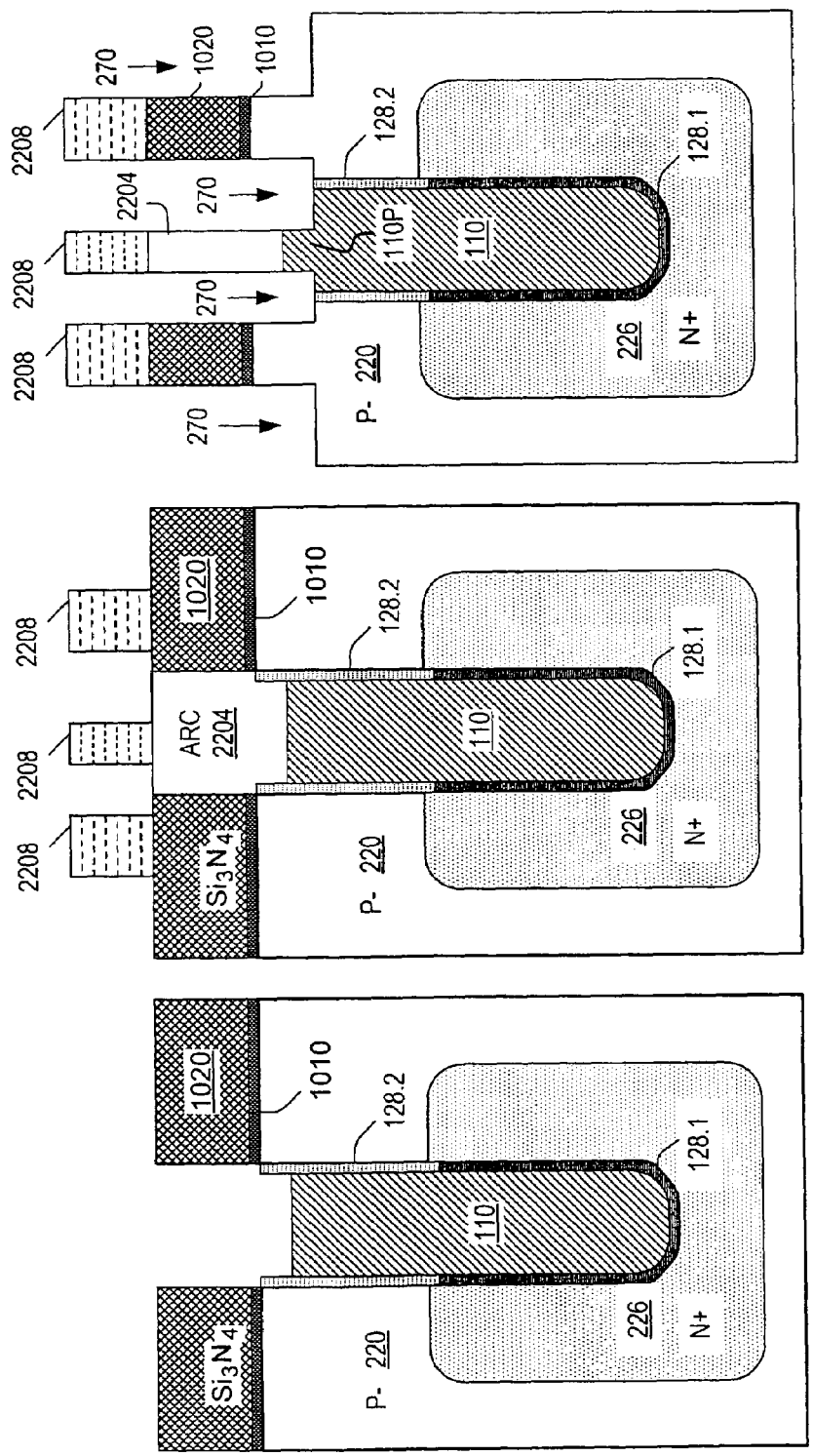

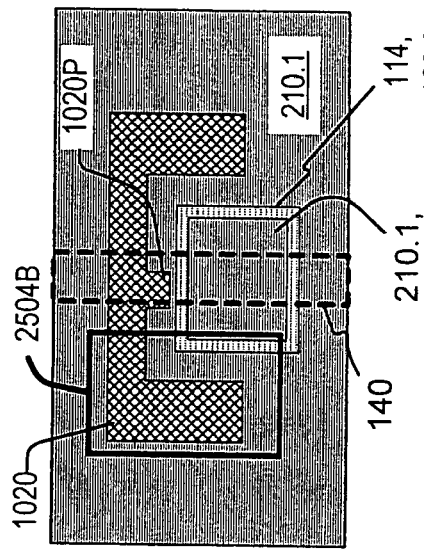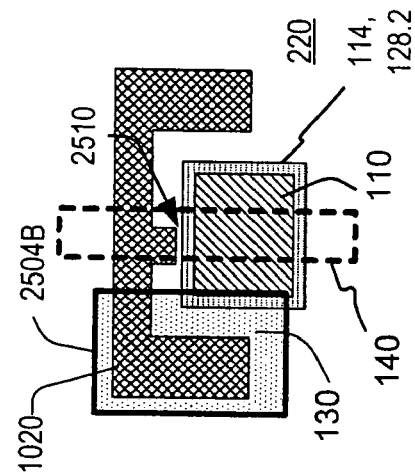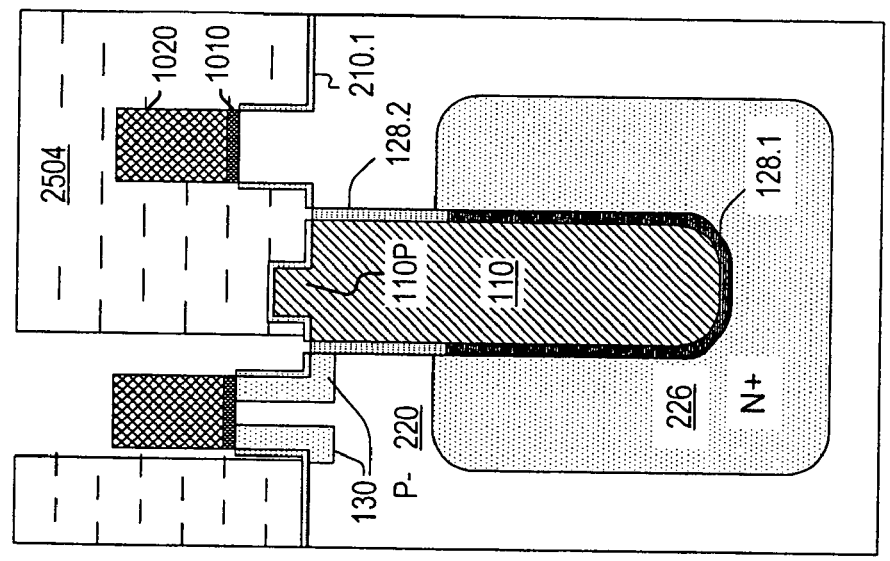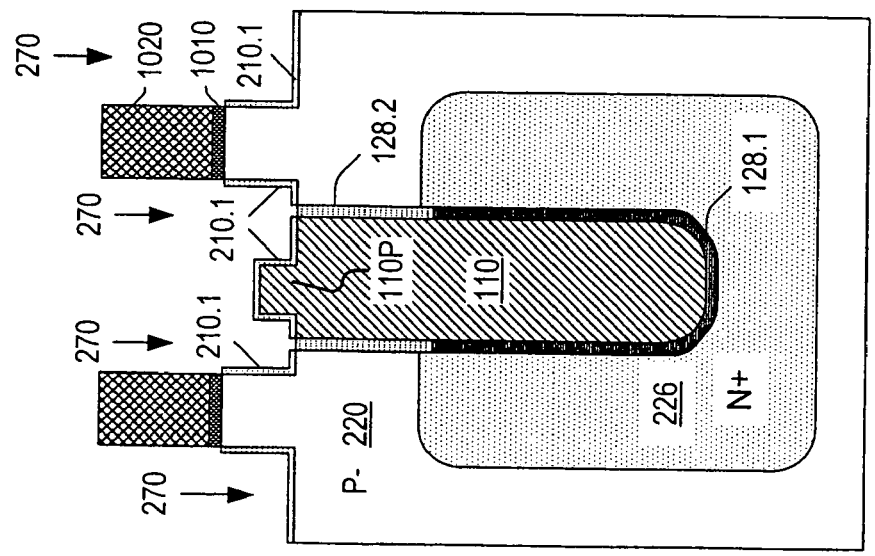
FIG. 25B
FIG. 25C
FIG. 25A
FIG. 24

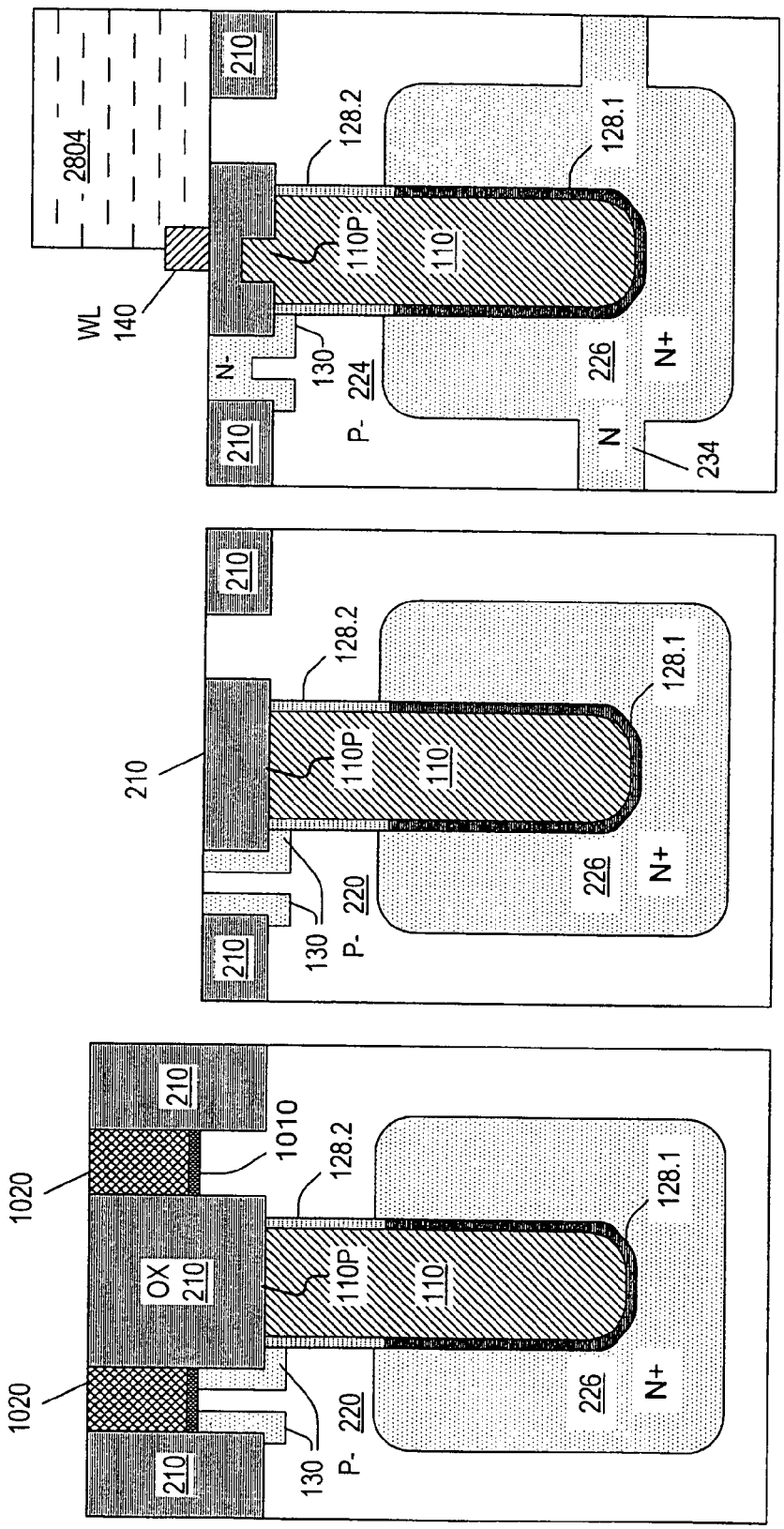

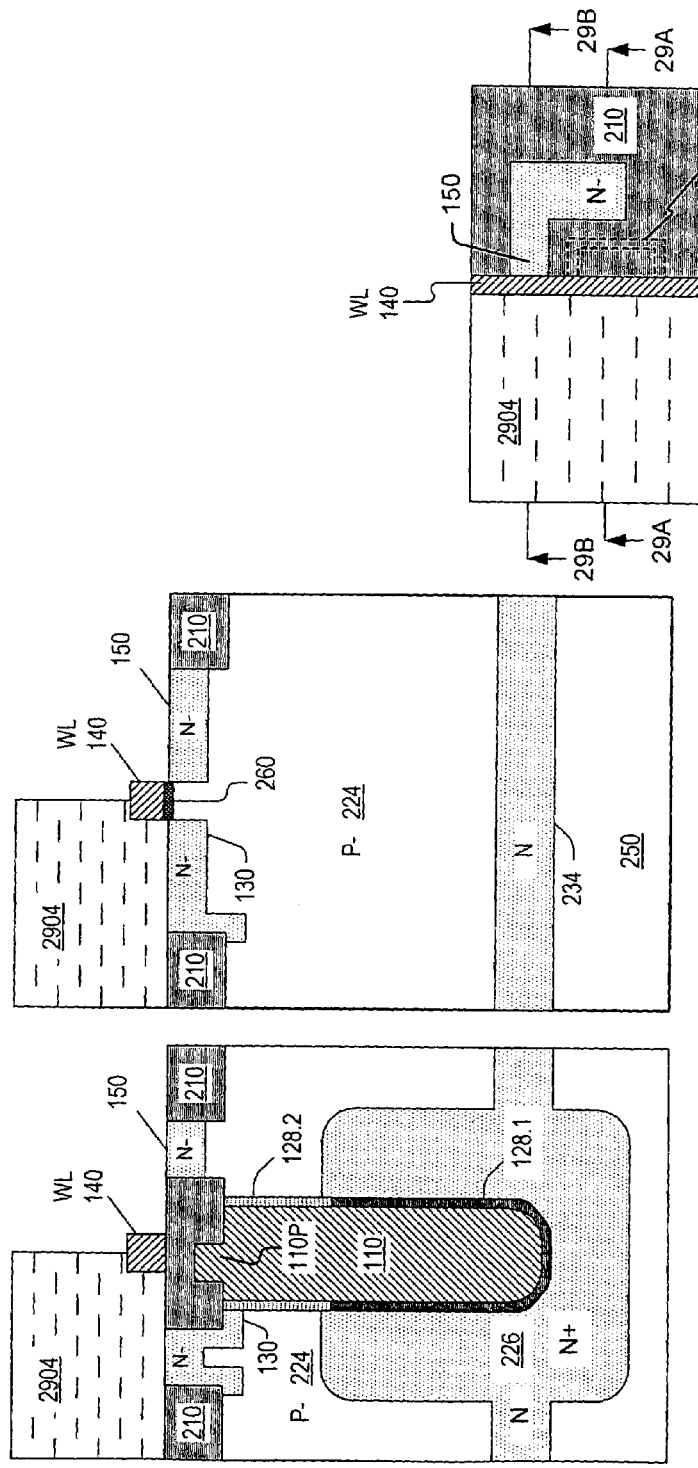

NONVOLATILE MEMORY CELL WITH A FLOATING GATE AT LEAST PARTIALLY LOCATED IN A TRENCH IN A SEMICONDUCTOR SUBSTRATE

CROSS REFERENCE TO RELATED APPLICATIONS

The present application is a division of U.S. patent application Ser. No. 10/252,143 filed on Sep. 19, 2002, incorporated herein by reference.

BACKGROUND OF THE INVENTION

The present invention relates to nonvolatile memories.

FIG. 1 illustrates a nonvolatile memory cell with a floating gate 110 located in a trench 114 formed in a semiconductor substrate. The cell is obtained by adapting a trench capacitor DRAM (dynamic random access random memory) fabrication process. See U.S. Pat. No. 5,932,908 issued Aug. 3, 1999 to Noble, entitled "TRENCH EPROM", incorporated herein by reference. Trench 114 extends through a well 118 doped P– and a well 122 doped N+, to a region 126 doped P–. Dielectric 128 lines the trench. The capacitance of floating gate 110 is dominated by the capacitance between the floating gate and the N well 122.

Floating gate 110 serves as the gate of a vertical FET (field effect transistor). The channel of this transistor is located in P well 118. The source/drain regions are provided by N well 122 and an N+ diffusion region 130 located at the top of the trench.

Wordline 140 provides the gate for a lateral FET which serves as the select transistor of the memory cell. The channel of the select transistor is a region of P well 118. The source/drain regions are the region 130 and another N+ region 150 (bit line region).

The cell can be written by storing either a positive or a negative charge on the floating gate. The negative charge is stored by the channel hot electron injection. In this operation, bit line region 150 is grounded. Wordline 140 is brought up to some voltage VDD, turning on the select transistor. N well 122 is at 6V. Due to the capacitive coupling between the N well 122 and the floating gate, the floating gate voltage is raised, turning on the vertical FET. Hot electrons generated in the channel of the vertical FET are injected into the floating gate.

The negative charge is erased by Fowler-Nordheim tunneling from the floating gate to N+ region 130. In this operation, N well 122 is grounded, bit line region 150 is at 6V, and wordline 140 is at 8V.

Storing a positive charge on the floating gate is accomplished via Fowler-Nordheim tunneling of electrons to N+ region 130 (like the erase operation described above). The positive charge is erased by Fowler-Nordheim tunneling from P– region 126 to the floating gate.

To read the cell, a voltage difference of VDD is created between N well 122 and bit line region 150. Wordline 140 is at VDD. The current through the bit line region indicates the state of the memory cell.

One advantage of forming the floating gate in the trench is a small cell area. Another advantage is a high capacitive coupling between the floating gate and the N well 122 relative to the total floating gate capacitance. This high capacitive coupling efficiency (high capacitive coupling relative to the total floating gate capacitance) is easier to achieve than an efficient coupling between the floating and control gates in some non-trench structures, as described in the U.S. Pat. No. 5,932,908.

Another advantage is a close relationship to trench capacitor DRAM fabrication processes. This relationship facilitates integration of the floating gate memory and trench capacitor DRAM on one chip.

SUMMARY

This section summarizes some features of some embodiments of the invention. Other features and embodiments are described below. The invention is defined by the appended claims.

In some embodiments of the invention, a floating gate of a nonvolatile memory cell is formed in a trench as in FIG. 1, but the wordline has a portion overlying the trench. See FIG. 2A for example. This wordline positioning offers much flexibility in the memory layout. For example, the region 130 in FIG. 2A can be extended around the floating gate to increase the vertical FET channel width. A large vertical FET channel width reduces the cell's programming time if the cell is programmed by channel hot electron injection. The cell reading time can also be reduced due to a larger current through the cell.

In some embodiments of the present invention, the dielectric lining the trench is stronger against leakage near one of the source/drain regions of the floating gate transistor than near the channel region. For example, in FIG. 2A, the dielectric lining the trench has a bottom portion 128.1 near the bottom source/drain region 226 and has a portion 128.2 near the channel region. Bottom portion 128.1 is stronger against leakage than the portion 128.2. "Stronger" means the leakage per unit area is smaller at a given voltage across the dielectric. As is well known, small leakage improves data retention but undesirably increases the programming and erase times (or voltages). If the memory is not programmed or erased through the bottom source/drain region, the stronger dielectric near this region improves data retention without increasing the programming and erase times or voltages.

In some embodiments, additional dielectric is provided between the trench and a top part of a source/drain region of the floating gate transistor. For example, in FIG. 2A, the additional dielectric is a portion of dielectric 210 extending below the top surface of the substrate between the trench 114 and the top part of source/drain region 130. Region 130 passes under the dielectric 210 to meet the trench 114. The additional dielectric reduces the capacitance between the region 130 and the floating gate. The additional dielectric can be part of a field dielectric layer, i.e. the layer that isolates active areas of the integrated circuit from each other.

The features described above can be used separately or in combination. For example, some embodiments have a wordline arranged as in FIG. 1 (not overlying the trench), but the dielectric lining the trench is made stronger near a source/drain region of the floating gate transistor (like dielectric 128.1, 128.2 in FIG. 2A). In some embodiments with the stronger dielectric, a select transistor is absent. Also, the additional dielectric between the trench and a top part of a source/drain region (like dielectric 210 in FIG. 2A) can be provided in memories in which the wordline does not overlie the trench, and in memories that do not have a select transistor.

Other features of the invention are described below.

BRIEF DESCRIPTION OF THE DRAWINGS

FIGS. 10–24 and 25A show vertical cross sections of the memory cell of FIG. 2A in the process of fabrication.

FIGS. 25B, 25C are top views of the structure of FIG. 25A.

FIGS. 26, 27, 28A, 28B show vertical cross sections of the memory cell of FIG. 2A in the process of fabrication.

FIGS. 29A, 29B show vertical cross sections of the memory cell of FIG. 2A in the process of fabrication.

FIG. 29C is a top view of the structure of FIGS. 29A, 29B.

DESCRIPTION OF SOME EMBODIMENTS

The embodiments described in this section illustrate but do not limit the invention. In particular, the materials, dimensions, voltage values, and fabrication processes are not limiting. Some information on the materials, processes, dimensions and other values given below is based on the inventors' knowledge of DRAM and other pertinent technologies and has not been tested for a non-volatile memory. The materials, dimensions, and other values may have to be modified based on the available fabrication technology and desired operational characteristics.

Figure 2A:
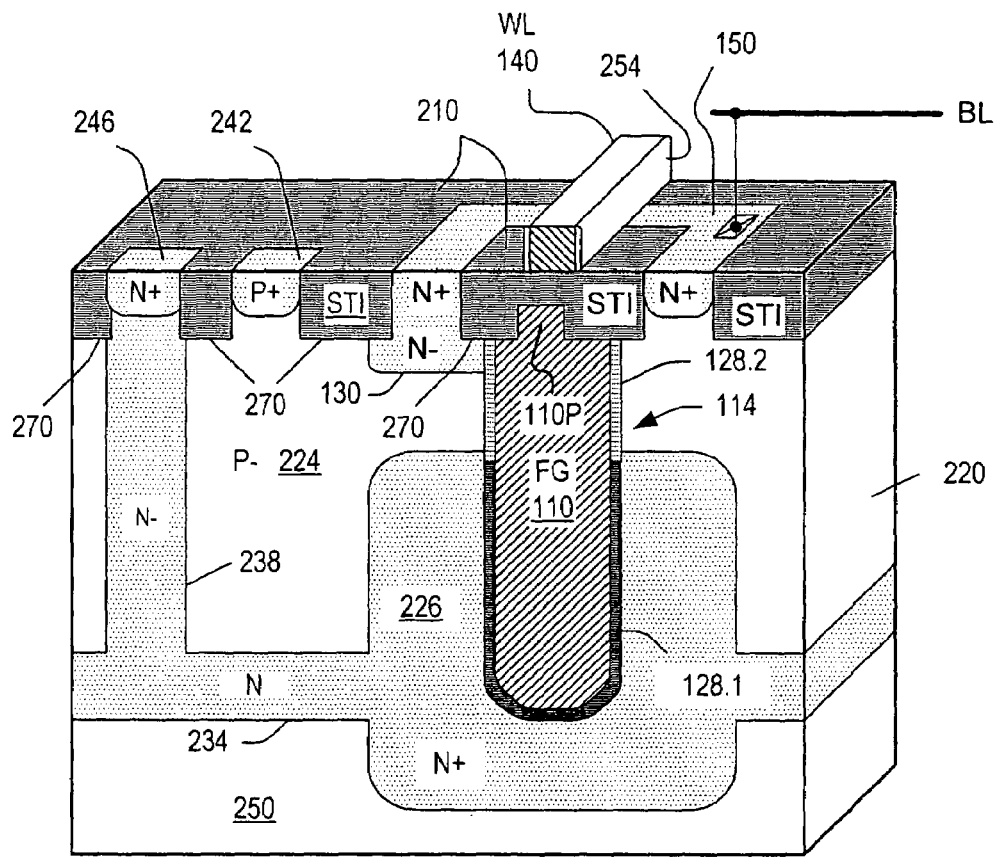
FIG. 2A shows a vertical cross section and a perspective view of an integrated circuit incorporating a memory cell according to one embodiment of the present invention.
Figure 2B:
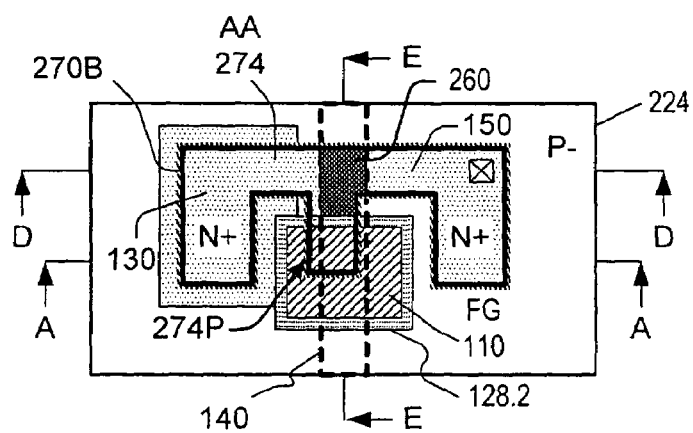
FIGS. 2B, 2C are tops views of the cell of FIG. 2A.
Figure 2C:
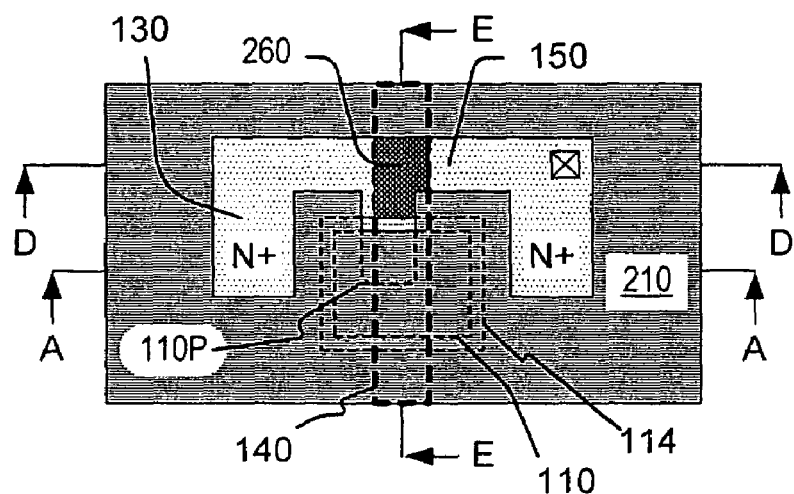
Figure 2D:
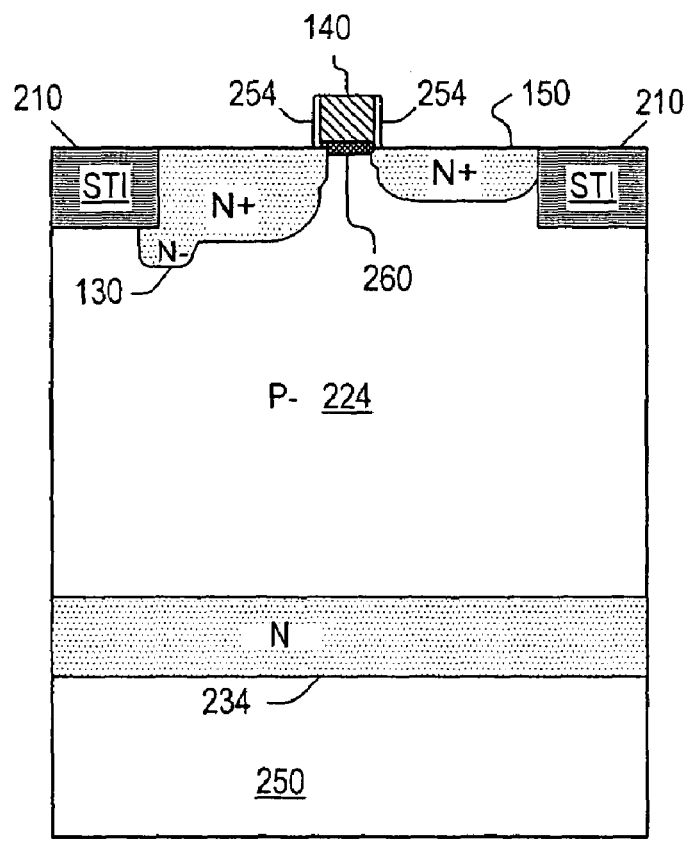
FIGS. 2D, 2E show vertical cross sections of the cell of FIG. 2A.
Figure 3:
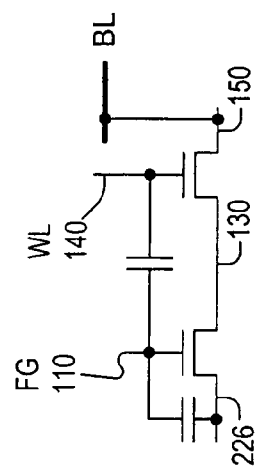
FIG. 3 is a circuit diagram of the cell of FIG. 2A.
Figure 2E:
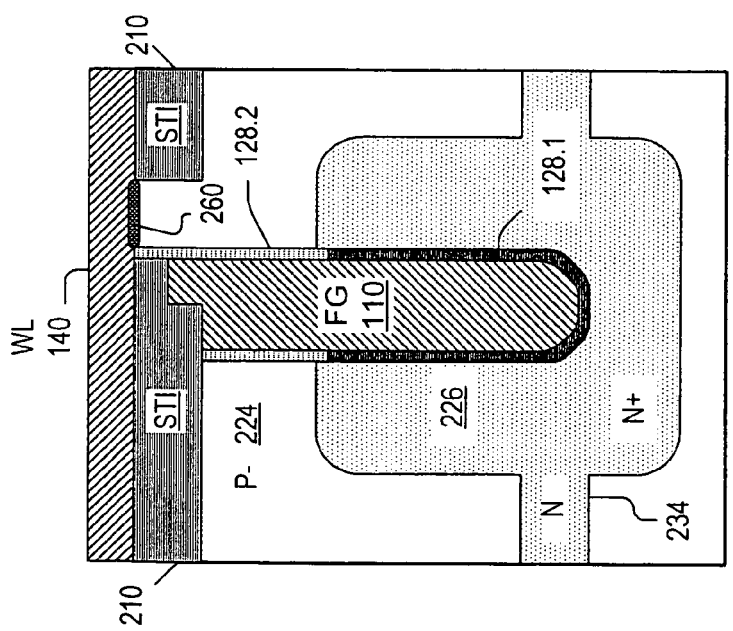

FIG. 2A shows a vertical cross section and a perspective view of an integrated circuit with a nonvolatile EEPROM memory cell. FIG. 2B is a top view, with field dielectric 210 and wordline 140 removed. The wordline boundary is shown by a dashed line. FIG. 2C is a top view with dielectric 210 present but the wordline removed. The wordline boundary, the boundary of trench 114, and the boundary of the floating gate are shown by dashed lines. The front cross sectional plane in the view of FIG. 2A is the plane through the line A—A in FIGS. 2B, 2C. The cross sections along the lines D—D and E—E are shown respectively in FIGS. 2D and 2E. FIG. 3 is a circuit diagram of the cell.

Semiconductor substrate 220 can be made of any suitable semiconductor material, e.g. monocrystalline silicon. Floating gate 110 (doped polysilicon or other conductive material) is formed in trench 114 in substrate 220. The substrate includes a well 224 doped P− and a region 226 doped N+. The trench extends through the well 224 to region 226. Region 226 (called "control plate" herein) provides a source/drain region for the vertical floating gate transistor. Floating gate 110 is the gate of this transistor.

Floating gate 110 is separated from substrate 220 by dielectric 128 (combination of dielectric regions 128.1, 128.2). Dielectric 128.1, 128.2 covers the surface of trench 114. The floating gate at least partially fills the trench (more precisely, the floating gate at least partially fills the inner trench region left unoccupied by dielectric 128). Dielectric 128.1 is below dielectric 128.2, and is stronger against leakage than dielectric 128.2. At least part of dielectric 128.1 is adjacent to control plate 226. At least part of dielectric 128.2 is adjacent to the P well 224 (to the channel region of the floating gate transistor).

P well 224 is bounded below by N type "band" region 234, and is surrounded laterally on all sides by N− type region 238 that meets the N band 234. Multiple cells (not shown) may be formed in this well. The well can be biased to a desired voltage via P+ region or regions 242 formed in the well at the top of the substrate. Regions 238, 234, and region 226 that meets the N band 234, can be biased to a desired voltage via N+ region or regions 246 located in region 238 at the top of the substrate. In some embodiments, the P type region 250 located under the N band 234 and under the control plate 226 is itself a well surrounded on all sides and below by N type regions (not shown). These features are not limiting. The memory cell can be formed outside of any well. When a well is present, it can be biased by other means (e.g. via the bottom of the substrate).

N type control plate 226 is formed in substrate 220 at the bottom of trench 114. Control plate 226 merges with N band 234. Control plate 226 completely surrounds the trench 114 and has a large vertical overlap with the trench for a high capacitive coupling with the floating gate. Control plate 226 acts as one of the two source/drain regions of the floating gate transistor. The other source/drain region 130 ("source line" region) is an N type region of substrate 220 at the top of the trench. Source line region 130 also provides a source/drain region for the select transistor of the cell.

Select gate 140 (doped polysilicon or some other conductive material) has a portion that overlies the floating gate 110. Select gate 140 extends beyond the floating gate, and beyond the trench 114, to provide the gate for the select transistor. Select gate 140 can be part of a word line if the cell is part of a memory array. Dielectric spacers 254 can optionally be formed on the sidewalls of the select gate. The spacers are not shown in some of the figures.

Bit line region 150 (called so because it is connected to a bit line BL in some memory array embodiments) is an N+ doped region of substrate 220. This is a source/drain region of the select transistor. Region 150 is spaced from trench 114. The channel region of the select transistor is a region of P well 224 underneath the wordline 140. Gate dielectric 260 (FIGS. 2B–2E) formed on the channel region separates the channel from the wordline.

Dielectric layer 210 can be formed by any suitable techniques, known or to be invented. In the embodiment being described, layer 210 is silicon dioxide formed by shallow trench isolation (STI) technology, and we will refer to this layer as "STI oxide". Oxide 210 fills shallow trench 270 formed in substrate 220. Trench 270 overlaps the trench 114. Trench 270 and oxide 210 can be made during the formation of field isolation regions that isolate active areas (not shown) elsewhere in the integrated circuit. Trench 270 is not as deep as trench 114. Oxide 210 has a portion that separates the trench 114, and hence the floating gate, from the top part of source line region 130. Region 130 passes below the oxide 210 to reach the trench 114. Oxide 210 reduces the capacitance between the source line region 130 and the floating gate.

STI trench 270 is interrupted over trench 114 to make room for an upward protrusion 110P of floating gate 110.

This protrusion increases the capacitive coupling between the floating gate 110 and wordline 140 and allows the floating gate voltage to be determined essentially by the voltages on control gate 226 and wordline 140. STI oxide 210 is present over protrusion 110P. The protrusion is absent in some embodiments.

In some embodiments, the STI trench 270 does not overlap the trench 114.

The surface portion 274 (FIG. 2B) of substrate 220 not occupied by STI trenches 270 will be called "active area" herein (also denoted "AA"). In FIG. 2B, the boundary between STI trench 270 and active area 274 is marked by line 270B. Trench 270 is outside of this line.

Trench 270 separates the deep trench 114 from bit line region 150, and extends under the wordline 140 near the bit line region, to reduce a leakage current between the control plate 226 and the bit line region.

Active area 274 includes the channel region of the select transistor, the bit line region 150, and a portion of source line region 130. Another portion of the source line region extends along the sidewalls and the bottom of trench 270 to the trench 114. Active area 274 has a protrusion 274P that extends from the channel region of the select transistor inside the deep trench 114. Floating gate protrusion 110P is inside the protrusion 274P. The protrusion 274P extends beyond the wordline 140 on the side of source line region 130. Therefore, the active area portion of source line region 130 meets the trench 114 near the wordline.

Protrusion 274P is absent in some embodiments.

As shown in FIG. 3, the memory cell includes the floating gate transistor and the select transistor connected in series between control plate 226 and bit line region 150. Source line region 130 is a common source/drain region.

Figure 4:
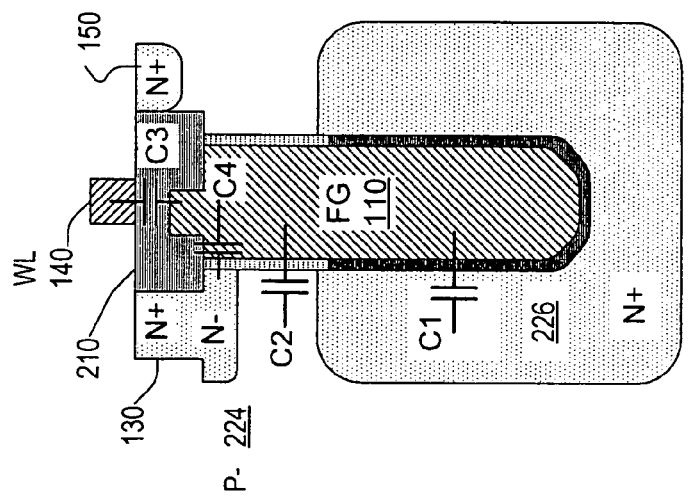
FIG. 4 is shows a vertical cross section of the cell of FIG. 2A and also shows the components of the floating gate capacitance.

As shown in FIG. 4, the floating gate capacitance includes the following components: the capacitance C1 with respect to control plate 226, the capacitance C2 with respect to P well 224, the capacitance C3 with respect to wordline 140, and the capacitance C4 with respect to source line region 130. The capacitance C1 is large relative to C1+C2+C3+C4 due to a large vertical overlap between the floating gate and the control plate. Control plate 226 completely laterally surrounds the trench 114, further increasing the capacitance C1. In some embodiments, the ratio $$R = C1/(C1+C2+C3+C4)$$

is at least 60%. The R ratio can be 70%, 80% or higher even in the absence of protrusion 110P. Protrusion 110P increases the C3 component relative to C2+C4 while still providing a high R ratio.

Exemplary dimensions are as follows. Trench 114 is 4 μm to 7 μm deep (as measured from the top surface of substrate 220). STI trench 270 is 0.25 μm deep. Source line region 130 is 0.3 μm deep, so the vertical overlap between the source line region and the floating gate is only 0.3−0.25=0.05 μm. The P well channel region of the floating gate transistor is 0.3 μm in height. Therefore, the vertical overlap between the floating gate and the control plate 226 is between 3.4 μm and 6.4 μm. Trench 114 is 0.5 μm wide in the view of FIGS. 2A and 4, and 0.2 μm wide in the view of FIG. 2E. Protrusion 110P is 0.18 μm×0.2 μm in top view, and is 0.2 μm in height. These dimensions are not limiting.

Figure 6:
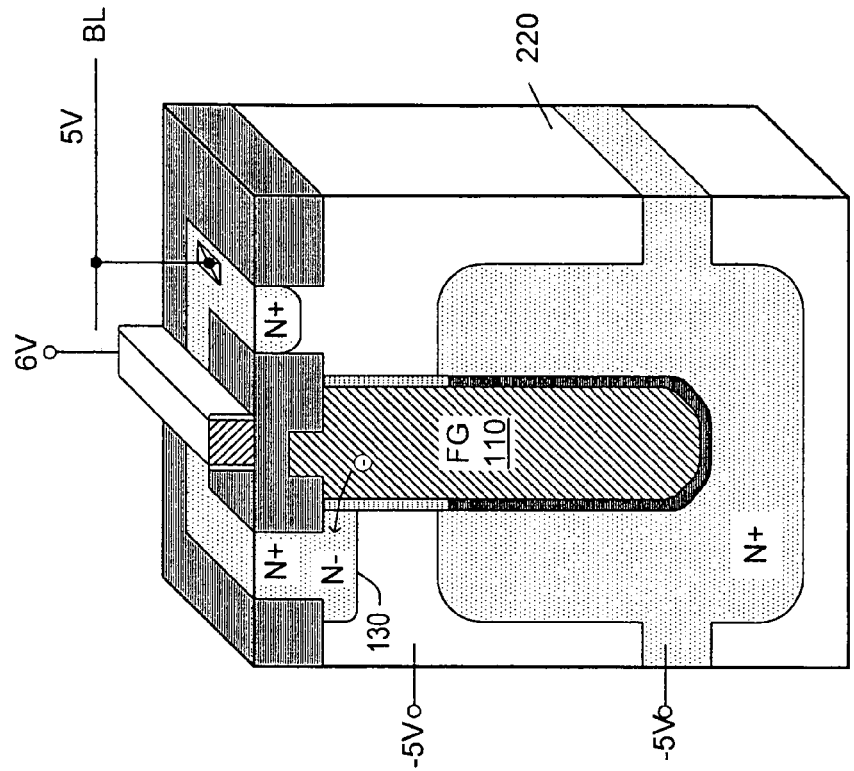
FIGS. 5, 6, 7 each show a vertical cross section and a perspective view of the cell of FIG. 2A with some operating voltages.
Figure 5:
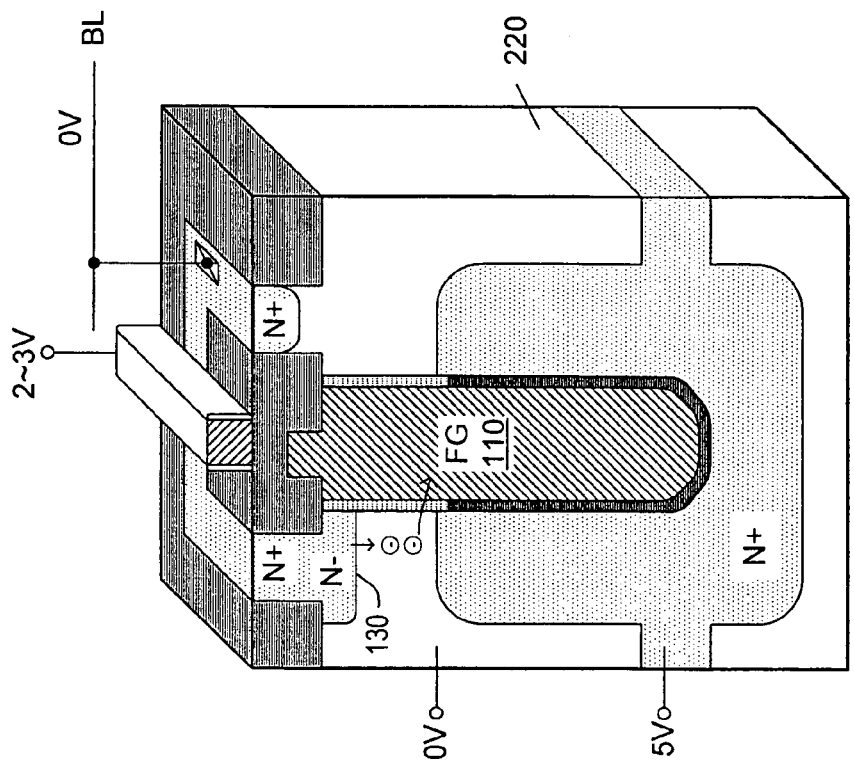
Figure 7:
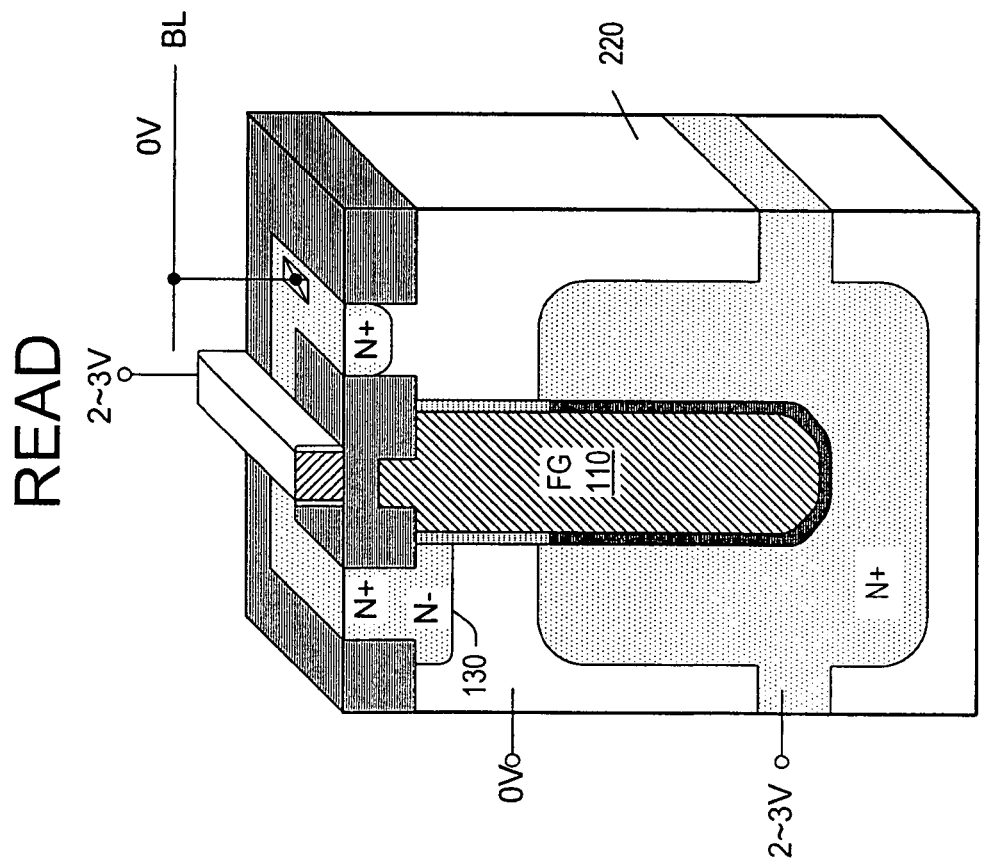

In some embodiments, the cell is programmed by channel hot electron injection. See FIG. 5, showing exemplary voltages for this operation. See also Table 1 below, showing the same voltages and also showing some voltages for non-selected cells in a memory array embodiment in which the array is formed in a common P well 224. The array can be a flash or non-flash EEPROM array. The voltages are given for a power supply voltage VDD of 2.6~3.3V, for 0.14 μm to 0.18 μm minimum line width fabrication technology. The hot electrons can be generated by either turning on the floating gate FET of the memory cell, or turning on the NPN transistor formed by regions 130 (emitter), 224 (base), 226 (collector), or by a combination of the FET and NPN actions. The cell is erased by Fowler-Nordheim tunneling through source line region 130. FIG. 6 and Table 1 show exemplary voltages. The cell operation mechanisms and voltages are exemplary and not limiting. For example, in some embodiments, the cell is programmed by Fowler-Nordheim tunneling. The cell geometry is also not limiting. For example, the control plate 226 can be absent, and the cell can be formed with the regions 118, 122, 126 of FIG. 1. The trench 114 can be positioned as in FIG. 1. The cell can be written with a positive charge, and erased through region 126, as in FIG. 1.

TABLE 1

|  | Program (V) | Erase (V) | Read (V) |
|---|---|---|---|
| Control Plate 226 | 5 | −5 | 2 to 3 |
| Bitline Region 150 | 0 (selected) 2 to 3 (non-selected) | 5 (selected) 0 (non-selected) | 0 |
| Wordline 140 | 2 to 3 (selected) 0 (non-selected) | 6 to 7 (selected) 0 (non-selected) | 2 to 3 (selected) 0 (non-selected) |
| P well 224 | 0 | −5 | 0 |

The cell layout is flexible due to flexibility in choosing the layout of source line region 130 and STI trench 270. In FIGS. 2A, 2B, the source line region curves around the deep trench 114 to provide a large channel width for the floating gate transistor. The large channel width serves to increase the transistor current, reducing the cell's programming and reading times.

Figure 1:
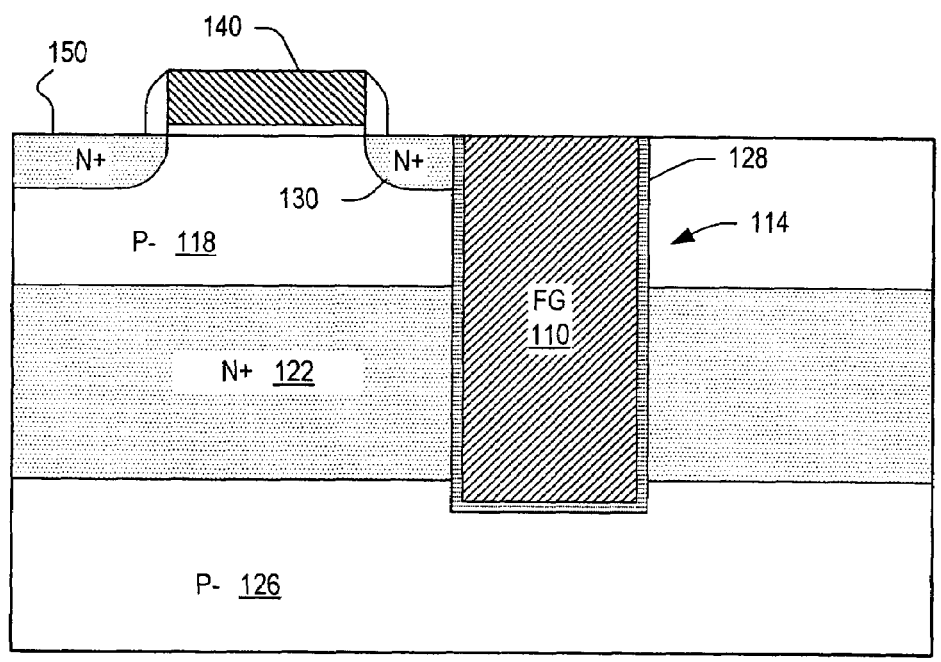
FIG. 1 shows a cross section of a prior art nonvolatile memory cell.

The cell need not be stretched out as much (compare the cell stretching from left to right in FIG. 1). The region occupied by the cell can approximate a square. As is well known, the square has the smallest perimeter of all the rectangles having a given area. A small cell perimeter allows one to reduce the area of the region separating the cell from the adjacent circuitry. The total area of the integrated circuit can therefore be reduced.

Figure 8A:
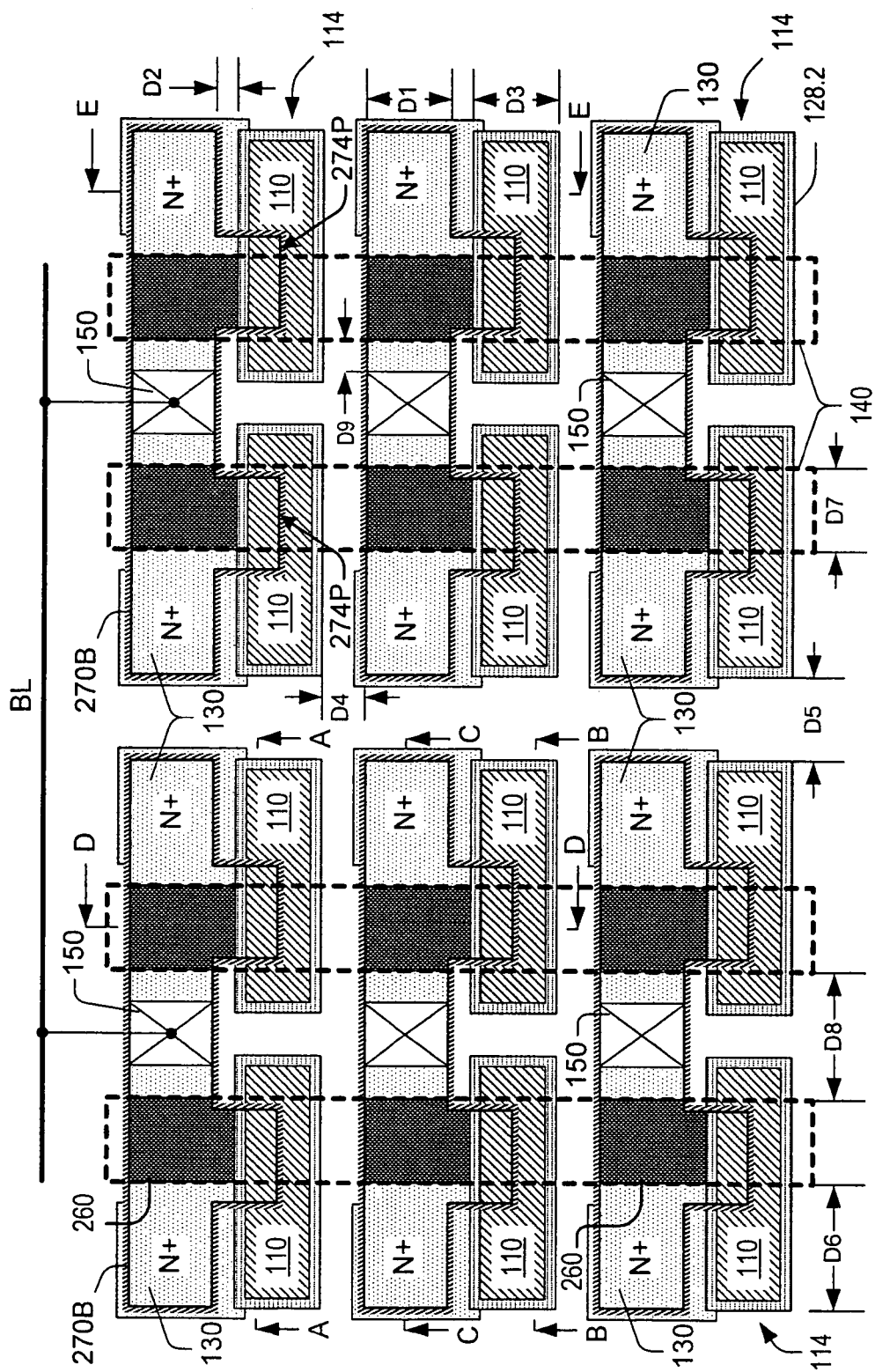
FIGS. 8A, 8B are top views of a memory array according to one embodiment of the present invention.
Figure 8B:
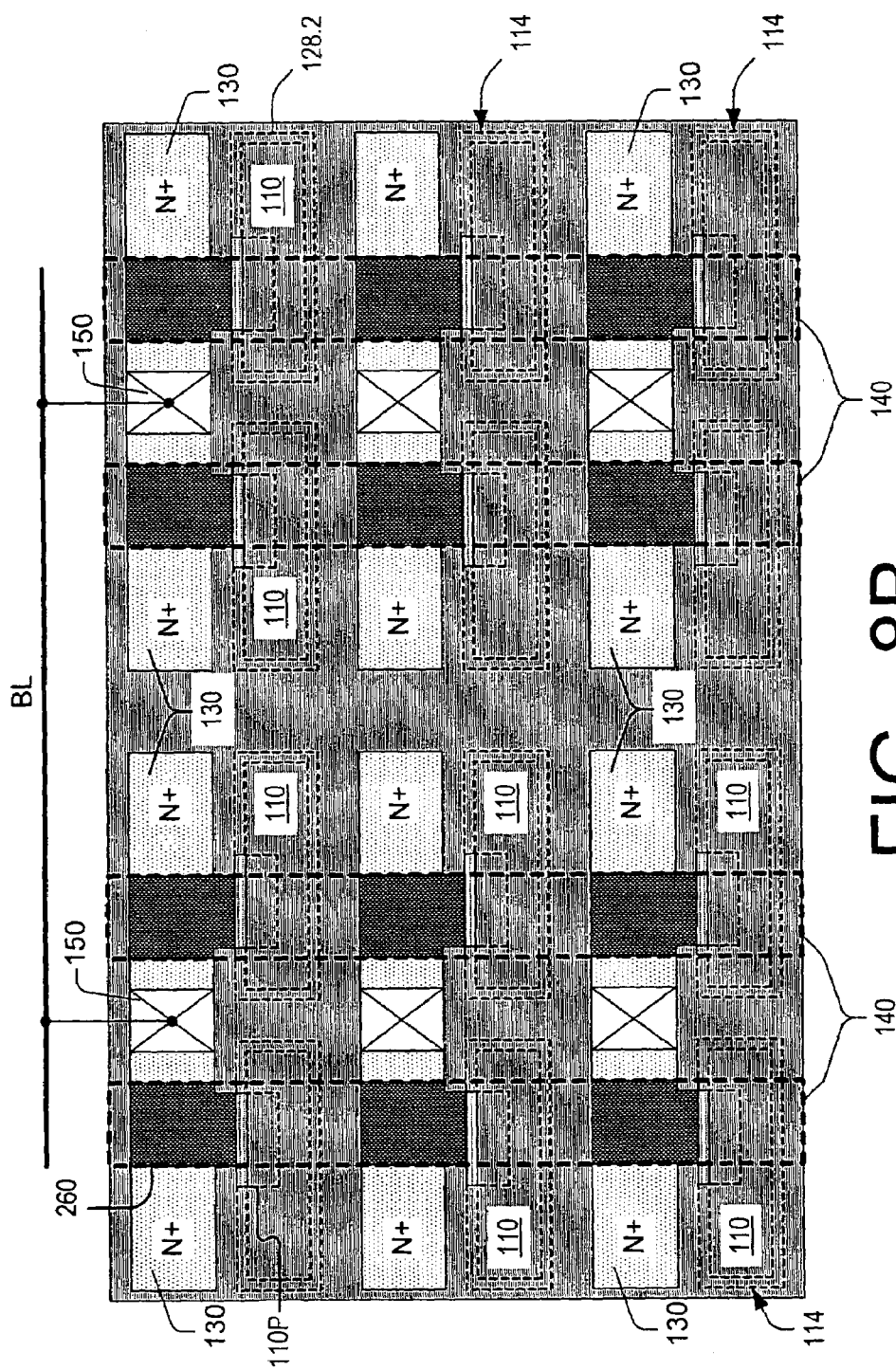

FIGS. 8A, 8B show the top views of an EEPROM memory array (which may or may not be a flash array) with an alternative memory cell layout. Wordlines 140 are removed in the view of these figures; the wordline boundaries are shown by dashed lines. STI oxide 210 is removed in the view of FIG. 8A but not in the view of FIG. 8B. The boundaries of STI trenches 270 are shown at 270B in FIG. 8A. The boundaries of deep trenches 114, floating gates 110, and protrusions 110P are shown by dashed lines in FIG. 8B. FIGS. 9A, 9B, 9C, 9D, 9E show cross sections along the lines A—A, B—B, C—C, D—D, E—E respectively in FIG. 8A.

Trenches 114 are longer in the bitline (column) direction, as shown in FIGS. 8A, 8B. The bitlines are generally perpendicular to wordlines 140. The bitlines can be formed from a conductive layer (not shown) deposited over the wordlines and insulated from the wordlines, as known in the art. The wordlines 140 extend in the row direction. The rows are grouped in pairs. In each pair of adjacent rows, two cells in the same column share the bitline region 150. The active areas of these two cells are merged into a single active area extending in the column direction along the two respective trenches 114. This merged active area has two protrusions 274P, one for each cell, as in FIG. 2B. The active area portions of source line regions 130 extend all the way to the respective trenches 114. The bitline region 150 is spaced from the trenches 114. The portions of source line regions 130 under the field oxide 210 curve around the corresponding trenches 114, but this is not necessary. In some embodiments, the source line regions are restricted to being on one side of the corresponding trenches 114 (above the trenches in the view of FIGS. 8A, 8B). The bitline regions do not curve around the trenches 114.

Figures 9A, 9B:
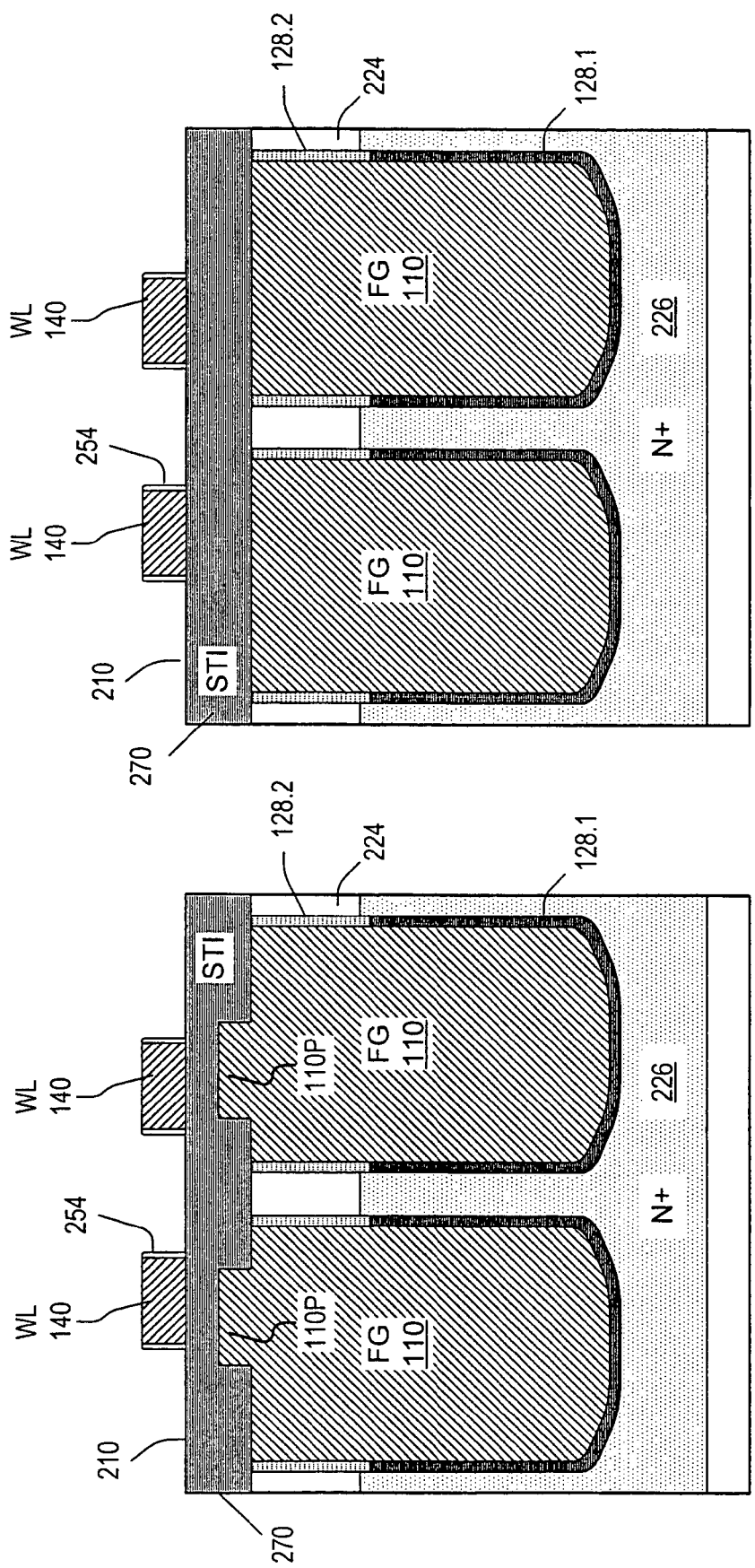
FIGS. 9A–9E show vertical cross sections of the memory array of FIGS. 8A, 8B.
Figure 9C:
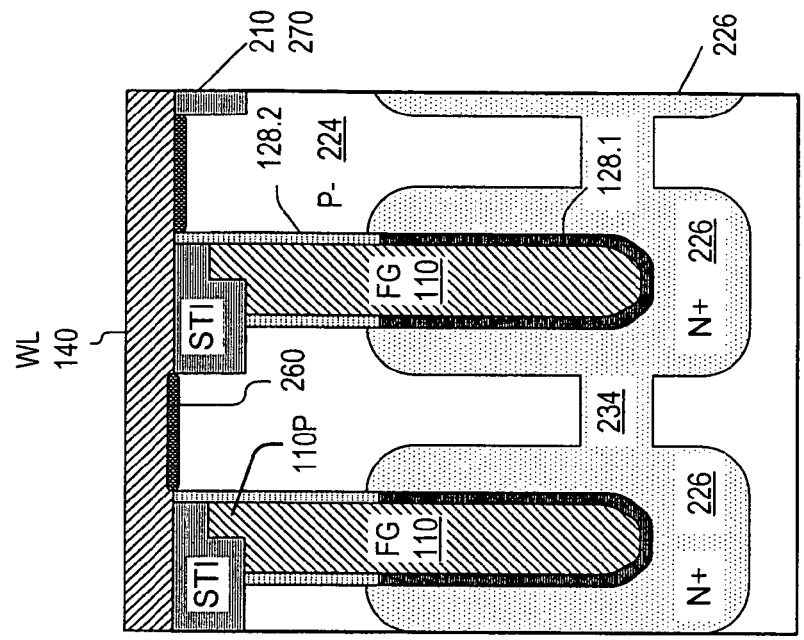
Figure 9D:
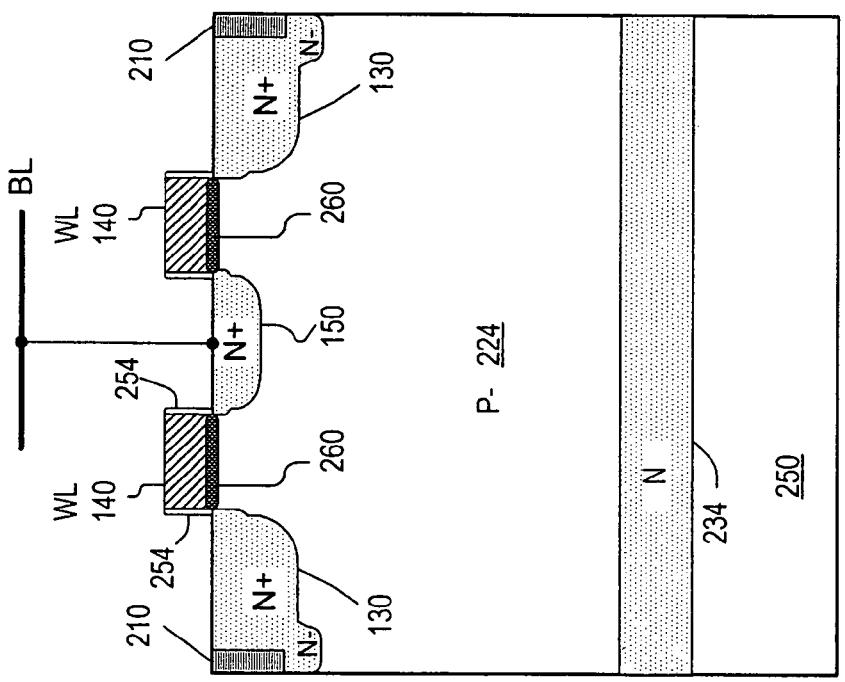
Figure 9E:
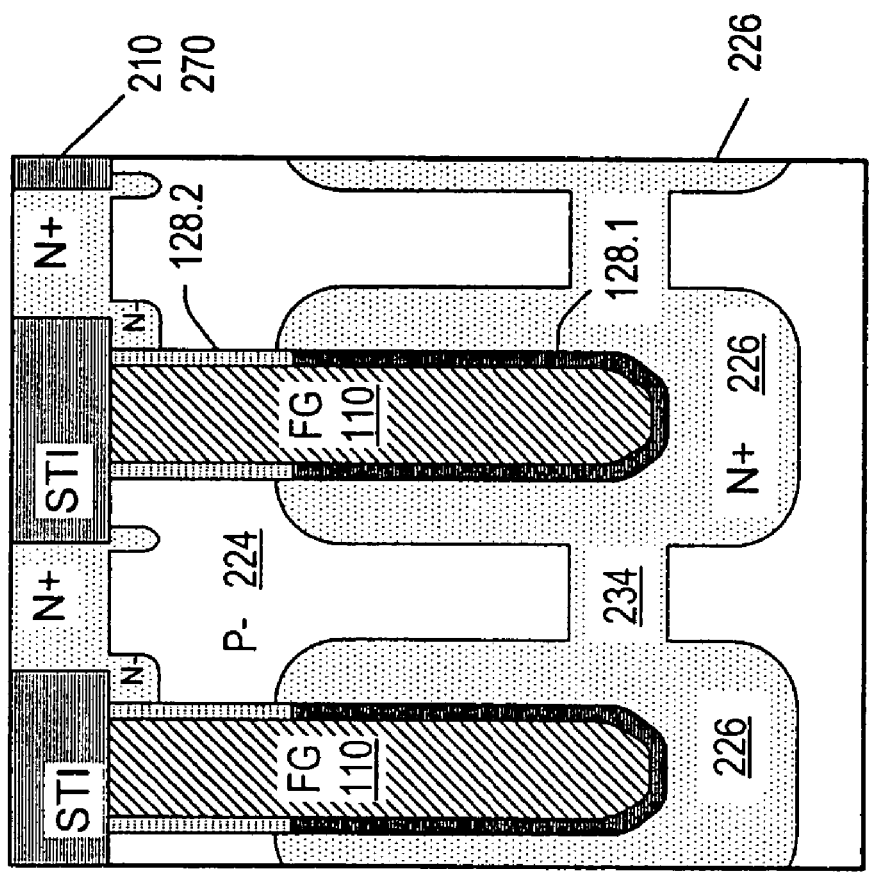

As shown in FIGS. 9A, 9B, the control plates 226 are merged together in each column. In FIGS. 9D, 9E, the control plates of different rows are spaced from each other, but they can be merged together if desired.

Exemplary dimensions marked in FIG. 8A are shown in Table 2 below.

TABLE 2

| | |
|---|---|
| D1 (AA width in WL (wordline) direction at edges of regions 130 and at bitline region 150) | 0.18 µm |
| D2 (distance between AA and deep trench 114 at edges of regions 130 and at regions 150) | 0.11 µm |
| D3 (deep trench 114 width in WL direction) | 0.20 µm |
| D4 (distance between deep trench 114 and the nearest active area in the adjacent column) | 0.12 µm |
| D5 (distance between adjacent deep trenches 114 in adjacent pairs of rows) | 0.18 µm |
| D6 (distance between wordline 140 and the farthest edge of trench 114 in a memory cell) | 0.24 µm |
| D7 (width of WL 140) | 0.18 µm |
| D8 (distance between WLs 140 in one pair of rows) | 0.26 µm |
| D9 (distance between WL 140 and bitline contact area in bitline region 150) | 0.08 µm |
| Cell area | (D1 + D2 + D3 + D4) * (D5/2 + D6 + D7 + D8/2) = 0.3904 µm² |

An exemplary fabrication process will now be described in detail for the embodiment of FIGS. 2A–2E. The same process is suitable for the embodiment of FIGS. 8A, 8B, 9A–9E, with the appropriate changes in the photolithographic masks. In the subsequent figures, the cross sectional plane is the same as in FIG. 2A unless noted otherwise.

Figure 10:
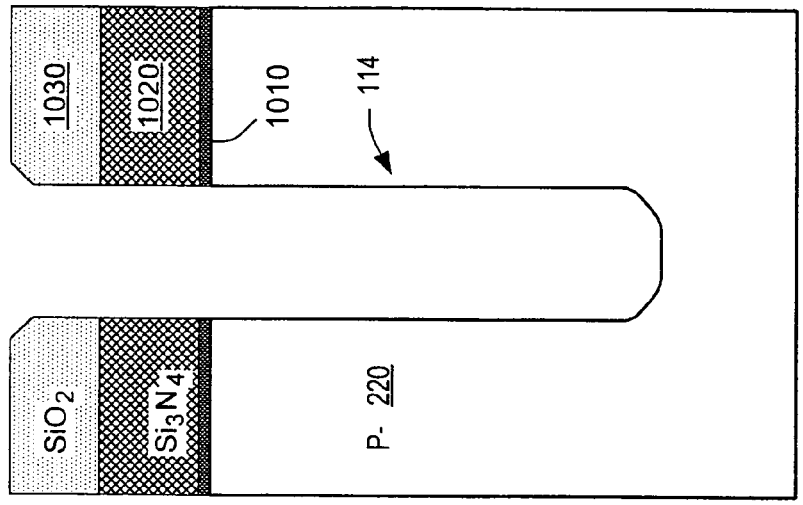

Substrate 220 (FIG. 10) can be P type monocrystalline silicon as described, for example, in U.S. Pat. No. 6,355,524 issued Mar. 12, 2002 to Tuan et al., entitled "NONVOLATILE MEMORY STRUCTURES AND FABRICATION METHODS", incorporated herein by reference.

Trenches 114 can be formed using DRAM trench capacitor technology. See e.g. the following patents incorporated herein by reference: U.S. Pat. No. 5,998,821 issued Dec. 7, 1999 to Hieda et al., entitled "DYNAMIC RAM STRUCTURE HAVING A TRENCH CAPACITOR"; U.S. Pat. No. 6,100,132 issued Aug. 8, 2000 to Sato et al., entitled "METHOD OF DEFORMING A TRENCH BY A THERMAL TREATMENT"; U.S. Pat. No. 5,264,716 issued Nov. 23, 1993 to Kenney, entitled "DIFFUSED BURIED PLATE TRENCH DRAM CELL ARRAY". In one embodiment, silicon dioxide layer 1010 (pad oxide) is grown thermally or deposited by chemical vapor deposition (CVD) on substrate 220 to an exemplary thickness of 100 Å. Silicon nitride 1020 is deposited on oxide 1010 by low pressure chemical vapor deposition (LPCVD) to a thickness of 2000 Å. Silicon dioxide 1030 is deposited on nitride 1020 by CVD from TEOS to a thickness of 700 Å. This layer will protect the nitride 1020 during the etch of substrate 220 that forms the trenches 114.

The wafer is coated with photoresist 1040. The resist is patterned to define the trenches 114. (Only one trench is shown, but multiple trenches and multiple memory cells can be formed at the same time.)

Figure 11:
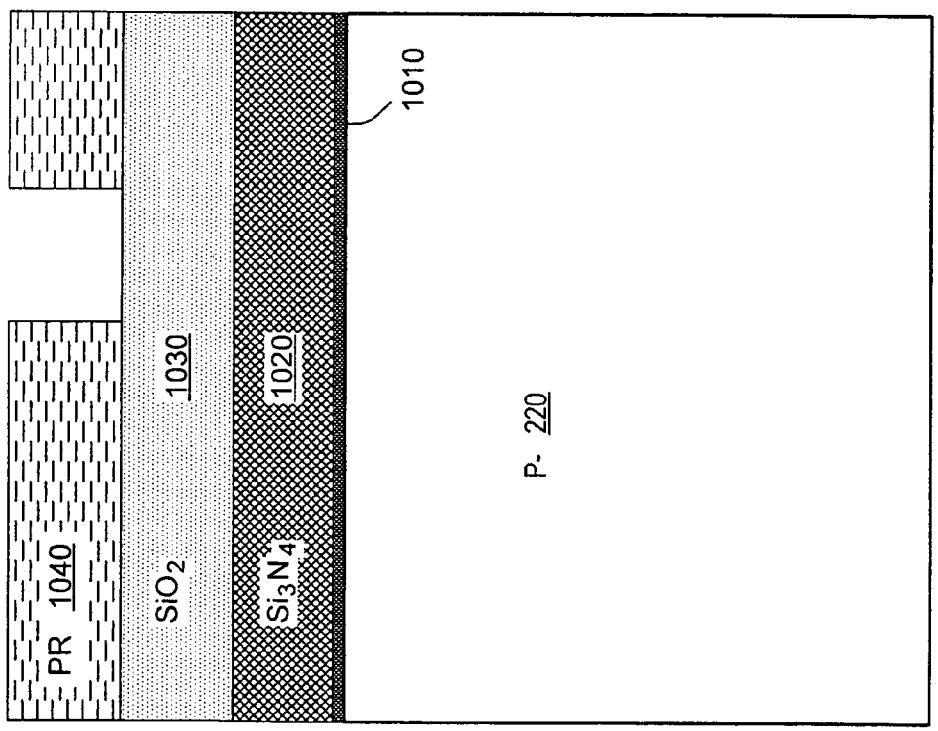

Oxide 1030, nitride 1020, and oxide 1010 are etched anisotropically by reactive ion etching (RIE) through the openings in resist 1040. Substrate 220 becomes exposed. The photoresist is removed, and the substrate is etched anisotropically by RIE with the layers 1010, 1020, 1030 as a mask. Trenches 114 are formed as a result (FIG. 11).

In some embodiments, during the etch of silicon substrate 220, the top edges of layer 1030 become tapered, widening towards the top. This profile will facilitate deposition of other layers into the opening in oxide 1030. See e.g. U.S. Pat. No. 6,410,391 issued Jun. 25, 2002 to Zelsacher (EEPROM), and U.S. Pat. No. 5,264,716 issued Nov. 23, 1993 to Kenney (DRAM), both incorporated herein by reference.

A layer 1210 (FIG. 12) is formed over the structure to provide a dopant source for N+ control plates 226. In some embodiments, layer 1210 is arsenosilicate glass (AsSG) deposited by LPCVD to a thickness of 700 Å. An exemplary arsenic concentration in layer 1210 is $10^{19}$ to $10^{20}$ atoms/cm³. Layer 1210 lines the trench surfaces.

The wafer is coated with positive photoresist 1220. The resist fills the trenches 114. Resist 1220 is exposed to a depth shown at 1220D (1 µm to 1.4 µm below the top surface of substrate 220 in some embodiments). Conventional resists can be used, with more sensitive resists (e.g. UV resists) believed to be more suitable for uniform exposure in the trench.

The exposed portion of resist 1220 is removed (FIG. 13). Then the portion of layer 1210 not covered by the resist is etched away (by HF for example). The remaining portion of resist 1220 is removed.

Silicon dioxide cap 1404 (FIG. 14) is deposited by CVD from TEOS to a thickness of 350 Å. Then the structure is heated to diffuse the N type dopant from layer 1210 into substrate 220. Regions 226 are formed adjacent to each trench. Cap oxide 1404 blocks the dopant outdiffusion from layer 1210 into the trench. The dopant outdiffusion is undesirable because the dopant could diffuse back into the substrate 220 at the top of the trench.

Layers 1404, 1210 are removed by a suitable etch (e.g. HF). This etch removes a small amount of oxide 1030 to further taper and round the oxide edges.

Then the bottom portion 128.1 of dielectric layer 128 is formed as follows. Dielectric film 128.1 (FIG. 15) is deposited over the structure to line the trench surface. In one example, dielectric 128.1 is a sandwich of silicon nitride/silicon oxide (NI/O) formed as follows. The silicon nitride portion is deposited by LPCVD to a thickness of 100 Å. Then the silicon dioxide portion is thermally grown to a thickness of 300 Å.

The wafer is coated with positive photoresist 1504. The resist fills the trenches 114. The resist is exposed to a desired depth 1504D, then developed. The portion of the NIO layer 128.1 that becomes uncovered is etched away by a suitable etch (a wet etch can be used). The remaining photoresist is removed. The resulting structure is shown in FIG. 16.

Figures 15, 16, 17:
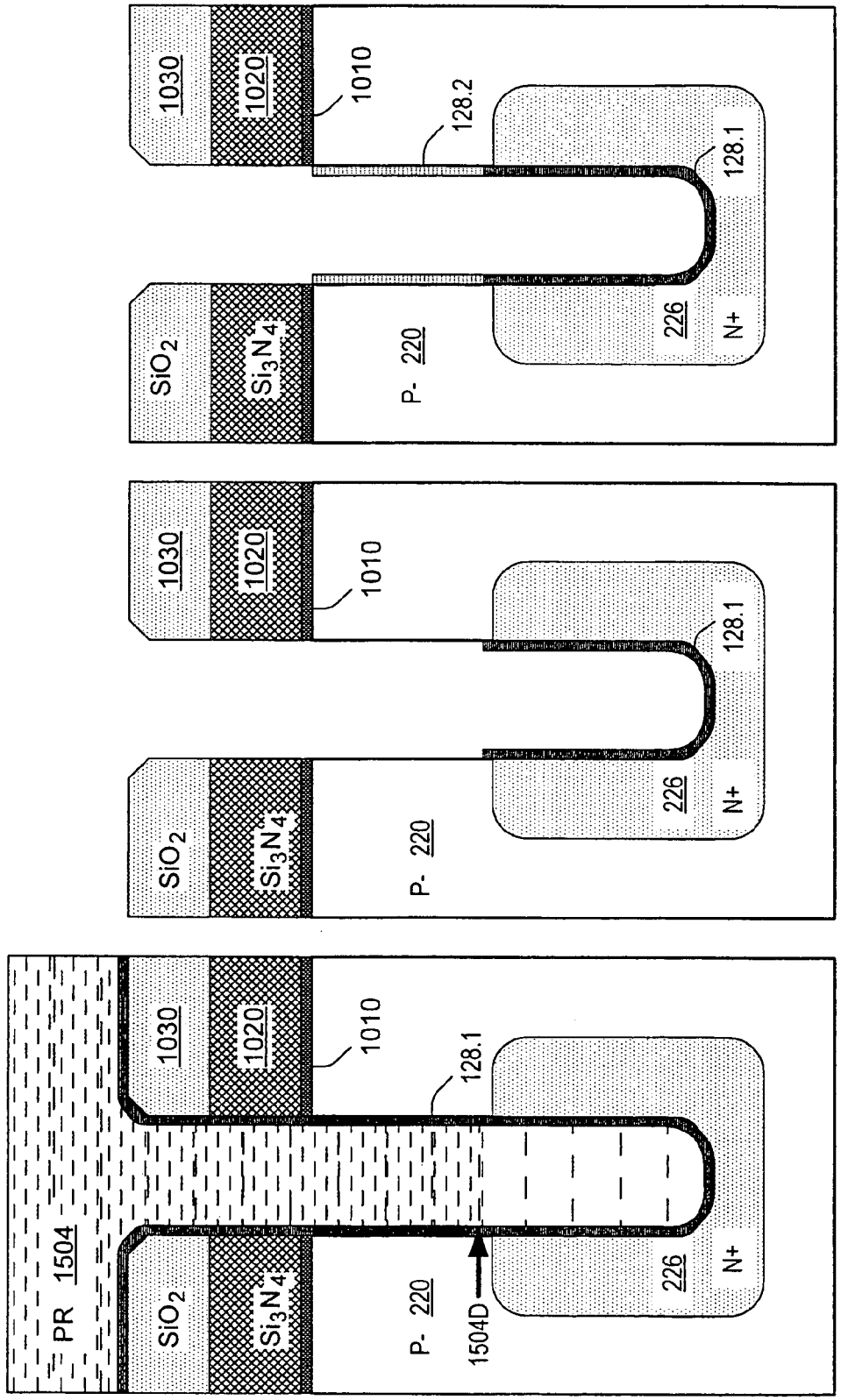

In this embodiment, the depth marker 1504D in FIG. 15, and hence the top level of layer 128.1 in FIG. 16, are above the top edge of N+ control plate 226. This is done to protect the trench sidewalls in the control plate region from high oxidation rates during subsequent formation of dielectric 128.2 (the N+ silicon on the sidewalls would oxidize fast if not covered by dielectric 128.1).

Silicon dioxide 128.2 (tunnel oxide) is formed by thermal oxidation. See FIG. 17. In some embodiments, oxide 128.2 is 90 nm thick. The thickness of the silicon dioxide portion of layer 128.1 may slightly increase during this step.

Figures 18, 19, 20:
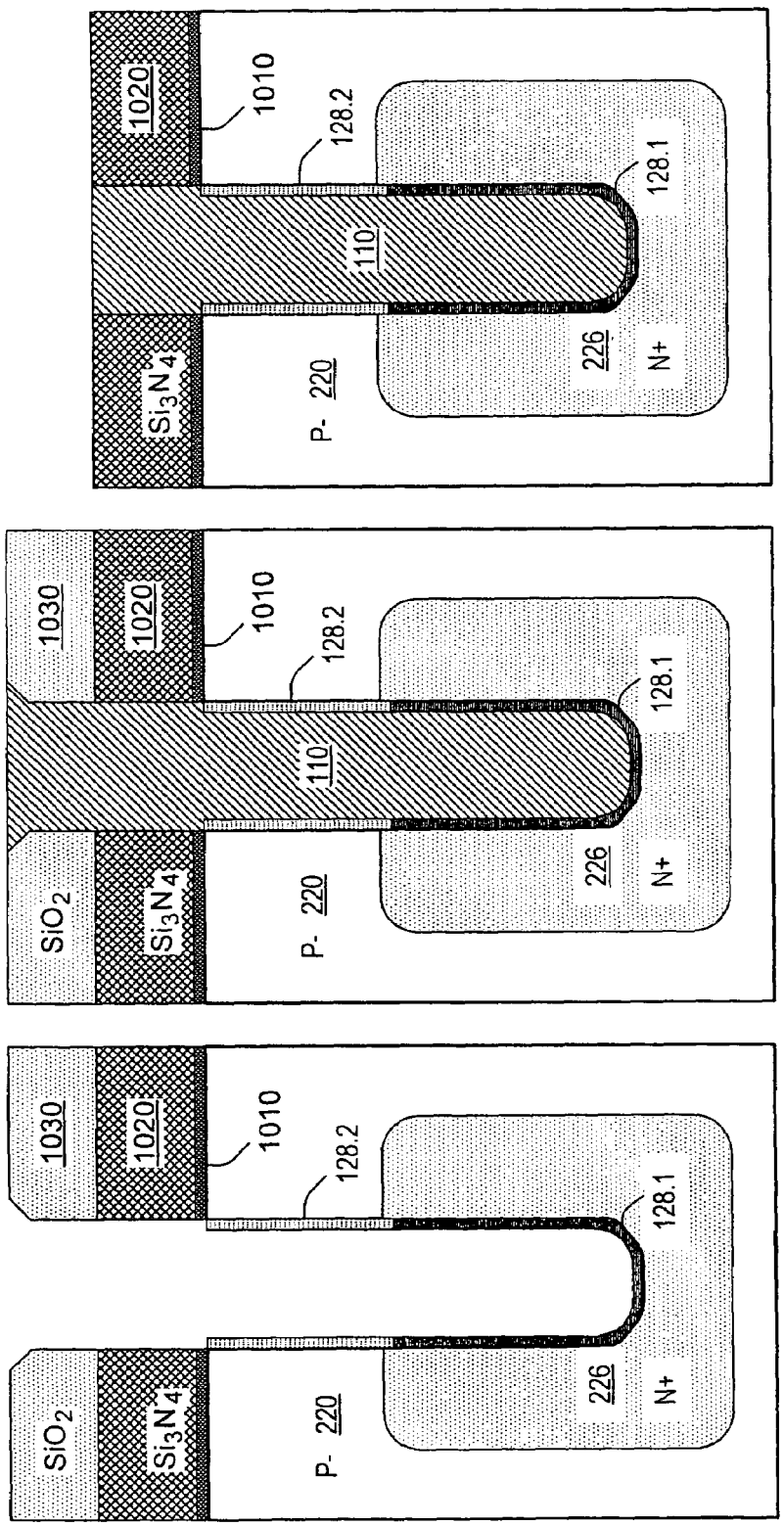

As shown in FIG. 18, the structure is heated to drive in the N type dopant in control plate region 226. Control plate 226 expands and reaches above the top edge of dielectric 128.1. This will prevent hot electrons generated during the cell programming from being trapped in the nitride portion of layer 128.1.

Doped polysilicon layer 110 (FIG. 19) is formed over the structure. Polysilicon 110 fills the trenches. Polysilicon 110 can be formed by CVD techniques used in DRAM trench capacitor technology. See e.g. U.S. Pat. No. 6,100,130 issued Aug. 8, 2000 to Iba et al., entitled "METHOD OF MANUFACTURING A SEMICONDUCTOR MEMORY DEVICE HAVING A TRENCH CAPACITOR", incorporated herein by reference. The portions of layer 110 over oxide 1030 are removed by chemical mechanical polishing (CMP) or some other planarization technique.

Oxide 1030 is removed. See FIG. 20. This etch is selective to silicon nitride and polysilicon, so no mask is needed. The portions of polysilicon 110 above the nitride 1020 are removed by CMP.

As shown in FIG. 21, polysilicon 110 is etched down until its top surface is below the top surface of substrate 220 (by 350 Å to 400 Å in some embodiments). The polysilicon etch can be a timed etch selective to silicon nitride 1020 and silicon dioxide 128.2, so no mask is needed.

Antireflective coating (ARC) 2204, shown in FIG. 22, is formed over the structure and planarized so that its top surface is level with the top surface of nitride 1020. Then a photoresist coat 2208 is formed on the wafer. The resist is patterned to define STI trenches 270. Trenches 270 are formed by etching the ARC layer 2204, silicon nitride 1020, pad oxide 1010, polysilicon 110, trench oxide 128.2, and substrate 220 through the openings in resist 2208. See FIG. 23. Floating gate protrusions 110P are formed in this step. In some embodiments, the etch is anisotropic with respect to all the materials etched.

Resist 2208 and ARC 2204 are removed (FIG. 24). Silicon nitride 1020 is subjected to a wet etch which pulls the nitride away from the trenches 270 by about 200 Å.

The structure is oxidized to round the exposed silicon edges and corners of trenches 114, 270 and polysilicon 110. Thin silicon dioxide film 210.1 is grown on the exposed silicon surfaces during this step. The rounded edges and corners will facilitate filling the STI trenches with silicon dioxide 210 shown in FIG. 2A. Layer 210.1 forms part of layer 210. The thickness of layers 128.2, 1010 can slightly increase during this step. In some embodiments, the oxidation is performed at 1000° C. in a dry oxygen atmosphere. For example, rapid thermal oxidation can be used.

Photoresist coat 2504 (FIG. 25A) is formed on the wafer. The resist is patterned to form an N– implant mask for portions of source line regions 130 at the bottom of trenches 270. The boundary of the mask opening is shown at 2504B in the top views of FIGS. 25B, 25C. These views have the same orientation as the view of FIG. 2B. Oxide 210.1 is shown in the view of FIG. 25B but removed in the view of FIG. 25C. Wordline 140 has not yet been formed, and is shown by a dashed line. The opening in mask 2504 can overlap the nitride 1020 since the nitride masks the implant. The nitride was pulled back from deep trench 114 by the wet etch described above with respect to FIG. 24. In that operation, a gap 2510 (FIG. 25C) was formed in which the active area is not covered by the nitride. The opening in mask 2504 is spaced from the future position of wordline 140 (by 0.8 µm to 0.11 µm in some embodiments), and from the gap 2510, to prevent the source line dopant from diffusing too far under the wordline and shortening and/or shorting the channel of the lateral transistor.

In some embodiments, the nitride protrusion 1020P does not exist (nitride 1020 is etched away near the trench 114 at the stage of FIG. 23).

N type dopant (e.g. phosphorus or arsenic) is implanted through the mask opening. In one example, the implantation dose is $10^{13}$ to $10^{14}$ atoms/cm$^2$, and the implant energy is 10 keV to 30 keV. The implant can be conducted at a non-zero angle relative to the direction perpendicular to the wafer. The angled implant allows doping of the STI trench sidewalls during this step. In one embodiment, the angle is 7°. Other parameters are also possible.

As shown in FIG. 25A, the implant forms N– regions 130 at the bottom of trenches 270. Due to the nitride pull back and the non-zero implantation angle, N– regions also form on the sidewalls of trenches 270 and in the active area near the nitride boundary.

Resist 2504 is removed. STI trenches 270 and the top portions of trenches 114 are filled with dielectric 210 (FIG. 26). Dielectric 210.1 is not shown separately. Dielectric 210 can be formed by a conventional STI process. In one embodiment, silicon dioxide is deposited with high density plasma (HDP) to fill the trenches and cover the structure. The oxide is polished by CMP that stops on nitride 1020. See the aforementioned U.S. Pat. No. 6,355,524.

Silicon nitride 1020 is removed (FIG. 27). Oxide 210 can be subjected to a timed etch to planarize the top surface of the structure. Alternatively, the etch can bring down the oxide level below the top surface of silicon 220, or on the contrary, the etch may stop before the structure is planarized, with the trench oxide protruding above the substrate 220. Pad oxide 1010 is removed in this etch.

N type regions 234, 238 (FIGS. 2A, 28A) are created by a series of ion implantation steps to create the isolated P well 224, as described in the aforementioned U.S. Pat. No. 6,355,524. Region 238 is not shown in FIG. 28A and the subsequent figures.

A P type dopant (e.g. boron) can be implanted into substrate 220 to adjust the doping concentration in P well 224. This implant adjusts the threshold voltages of the select and floating gate transistors of the memory cells. This can be a blanket implant, or a series of implantation steps with photoresist masks for independent adjustment of the threshold voltages of different transistors of the memory cells and possibly of other transistors (not shown) in the integrated circuit.

Silicon dioxide 260 (FIGS. 2B, 2C, 2D) is grown by thermal oxidation on the exposed active area regions to a suitable thickness, e.g. 100 Å to 120 Å. Polysilicon 140 is deposited and patterned to form the wordlines. See FIG. 28A. Oxide 260 can be completely or partially removed from the substrate areas not covered by polysilicon 140 during or after the polysilicon etch. Oxide 260 is not shown in the areas not covered by wordlines 140.

Figure 28C:
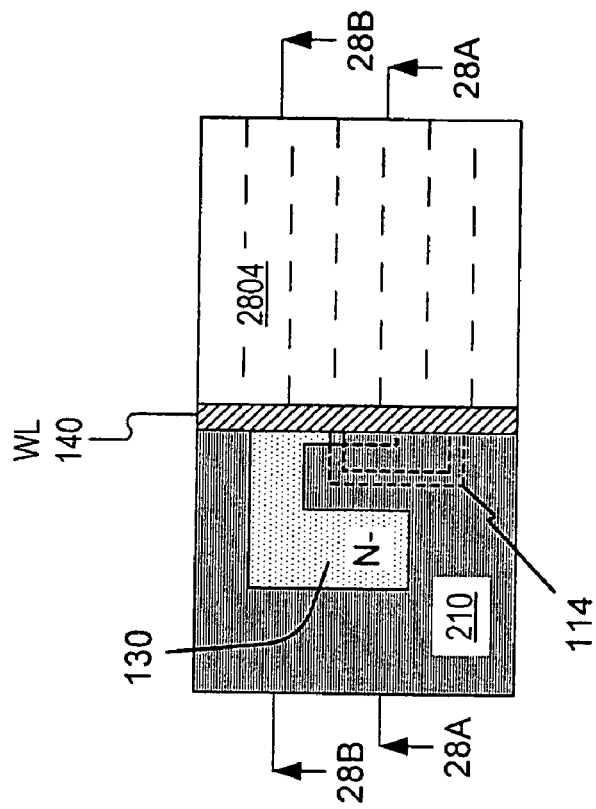
FIG. 28C is a top view of the structure of FIGS. 28A, 28B.
Figure 28B:
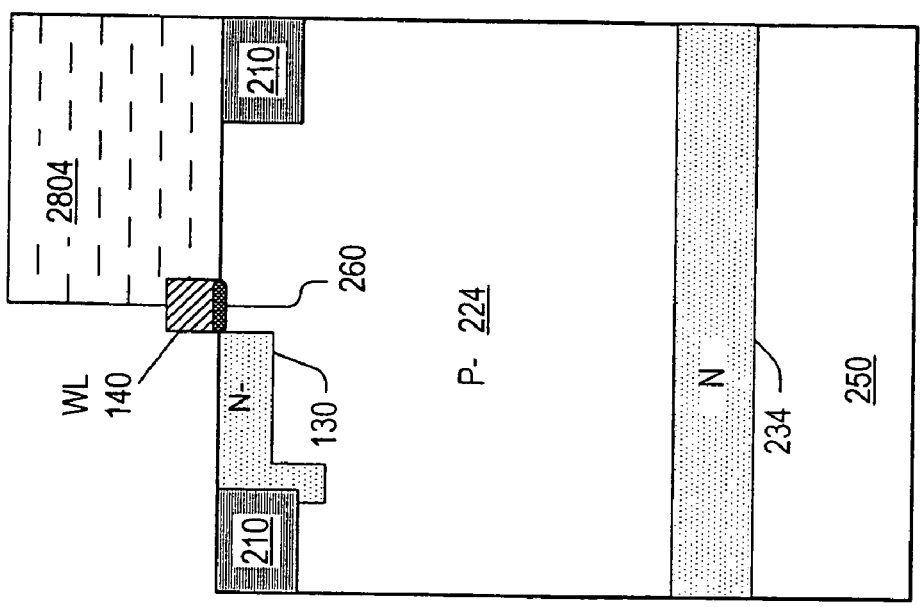

Source line regions 130 and bitline regions 150 can now be doped using conventional fabrication techniques. LDD (lightly doped drain), DDD (double diffused drain), or other doping profiles can be formed as desired for the select transistors. In one embodiment, an LDD doping profile is formed both at the source line regions and at the bitline regions for the select transistors as follows. The wafer is coated with photoresist 2804 (FIG. 28A). The resist is patterned to expose the source line regions. FIG. 28C shows the top view of the structure. FIG. 28A shows the cross section along the plane "28A—28A" marked in FIG. 28C (this is the same plane as the plane "A—A" in FIG. 2B). FIG. 28B shows the cross section along the plane "28B—28B" of FIG. 28C (this plane is marked "D—D" in FIG. 2B). An N type dopant (e.g. phosphorous) is implanted to dope the source line regions N−. Resist 2804 is removed, and a photoresist layer 2904 (FIGS. 29A, 29B, 29C) is formed on top of the wafer. FIG. 29C shows the top view of the structure. FIG. 29A shows the cross section along the plane "29A—29A" of FIG. 29C (plane "A—A" in FIG. 2B). FIG. 29B shows the cross section along the plane "29B—29B" of FIG. 29C (plane "D—D" in FIG. 2B). Resist 2904 is patterned to expose the bitline regions 150. An N type dopant is implanted to dope the bitline regions N−. Resist 2904 is removed, and spacers 254 are formed by a conformal deposition and an anisotropic etch of silicon dioxide or some other dielectric. If gate oxide 260 remains on the active areas not covered by wordline 140, oxide 260 can be removed during the etch of dielectric 254.

Then an N+ implant is performed into the source line regions 130 and bitline regions 150.

In the embodiment just described, the N− doping of source line regions 130 and bitline regions 150 is performed separately because it may be desirable to dope the bitline regions more heavily but make them shallower than the source line regions. The source line regions are doped more lightly to reduce hot electron generation in the floating gate transistor channel in read operations. In other embodiments, the regions 130, 150 are doped N− in the same implantation step.

In some embodiments, the LDD structure is created on the bitline side but not on the source line side in the select transistors.

In some embodiments, the doping step of FIGS. 25A–25C is omitted. The source line dopant implanted at the stage of FIGS. 28A–28C and the subsequent stages diffuses into the substrate and reaches the deep trench 114 under the STI trench 270 (under the STI oxide 210).

Fabrication can be completed using known BEOL (back end of the line) processing techniques.

The embodiments described above do not limit the invention. Other embodiments include other fabrication processes, materials, dimensions, or geometry. The invention is defined by the appended claims.

The invention claimed is:

1. An integrated circuit comprising a first nonvolatile memory cell, the integrated circuit comprising:
   a semiconductor substrate having a top surface and a trench formed in the top surface;
   a dielectric on a surface of the trench;
   a conductive floating gate at least partially located in the trench;
   wherein the first nonvolatile memory cell comprises a first field effect transistor (FET) whose conductivity is at least partially controlled by the floating gate, and comprises a second FET for controlling access to the first FET;
   wherein the substrate comprises:
      a first semiconductor region of a first conductivity type adjacent to the trench and providing a first source/drain region for the first FET;
      a second semiconductor region of a second conductivity type adjacent to the trench above the first semiconductor region and providing a channel region for the first FET;
      a third semiconductor region of the first conductivity type, wherein at least a portion of the third semiconductor region lies adjacent to the trench above the second semiconductor region and provides a second source/drain region for the first FET, wherein the third semiconductor region also provides a source/drain region for the second FET;
      a fourth semiconductor region of the second conductivity type adjacent to the third semiconductor region and providing a channel region for the second FET; and
      a fifth semiconductor region of the first conductivity type adjacent to the fourth semiconductor region and providing a source/drain region for the second FET;
   wherein the integrated circuit further comprises a conductive member having a portion overlying the trench, wherein the conductive member provides a gate for the second FET, wherein the gate for the second FET is adjacent to the channel region of the second FET.

2. The integrated circuit of claim 1 wherein said portion of the conductive member overlies the floating gate.

3. The integrated circuit of claim 1 wherein the entire third semiconductor region is located on one side of the trench.

4. The integrated circuit of claim 3 wherein the third, fourth and fifth semiconductor regions are entirely located on one side of the trench.

5. The integrated circuit of claim 1 wherein the dielectric on the surface of the trench is stronger against leakage adjacent at least a portion of the first semiconductor region than adjacent at least a portion of the second semiconductor region.

6. The integrated circuit of claim 5 wherein a stronger portion of the dielectric adjacent the first semiconductor region comprises silicon nitride, and a less strong portion of the dielectric adjacent the second semiconductor region consists of silicon oxide.

7. The integrated circuit of claim 5 wherein all of a stronger portion of the dielectric on the surface of the trench is adjacent to the first semiconductor region.

8. The integrated circuit of claim 5 wherein some of a weaker portion of the dielectric on the surface of the trench is adjacent to the first semiconductor region.

9. The integrated circuit of claim 5 wherein a weaker portion of the dielectric on the surface of the trench is located above a stronger portion of the first dielectric.

10. The integrated circuit of claim 9 wherein the first semiconductor region extends up higher than a stronger portion of the dielectric on the surface of the trench and meets a weaker portion of the dielectric.

11. The integrated circuit of claim 1 wherein all of the floating gate is in the trench.

12. The integrated circuit of claim 11 wherein the floating gate is below the top surface of the semiconductor substrate.

13. An integrated circuit comprising a first nonvolatile memory cell, the integrated circuit comprising:
   a semiconductor substrate having a top surface and a trench formed in the top surface;
   a dielectric on a surface of the trench;
   a conductive floating gate at least partially located in the trench;
   wherein the first nonvolatile memory cell comprises a first field effect transistor (FET) whose conductivity is at least partially controlled by the floating gate, and comprises a second FET for controlling access to the first FET;

wherein the substrate comprises:
a first semiconductor region of a first conductivity type adjacent to the trench and providing a first source/drain region for the first FET;
a second semiconductor region of a second conductivity type adjacent to the trench above the first semiconductor region and providing a channel region for the first FET;
a third semiconductor region of the first conductivity type, wherein at least a portion of the third semiconductor region lies adjacent to the trench above the second semiconductor region and provides a second source/drain region for the first FET, wherein the third semiconductor region also provides a source/drain region for the second FET;
a fourth semiconductor region of the second conductivity type adjacent to the third semiconductor region and providing a channel region for the second FET; and
a fifth semiconductor region of the first conductivity type adjacent to the fourth semiconductor region and providing a source/drain region for the second FET;

wherein the integrated circuit further comprises a conductive member having a portion overlying the trench, wherein the conductive member provides a gate for the second FET;

wherein the third semiconductor region curves around the trench adjacent to the trench.

14. An integrated circuit comprising a first nonvolatile memory cell, the integrated circuit comprising:
a semiconductor substrate having a top surface and a trench formed in the top surface;
a dielectric on a surface of the trench;
a conductive floating gate at least partially located in the trench;
wherein the first nonvolatile memory cell comprises a first field effect transistor (FET) whose conductivity is at least partially controlled by the floating gate, and comprises a second FET for controlling access to the first FET;

wherein the substrate comprises:
a first semiconductor region of a first conductivity type adjacent to the trench and providing a first source/drain region for the first FET;
a second semiconductor region of a second conductivity type adjacent to the trench above the first semiconductor region and providing a channel region for the first FET;
a third semiconductor region of the first conductivity type, wherein at least a portion of the third semiconductor region lies adjacent to the trench above the second semiconductor region and provides a second source/drain region for the first FET, wherein the third semiconductor region also provides a source/drain region for the second FET;
a fourth semiconductor region of the second conductivity type adjacent to the third semiconductor region and providing a channel region for the second FET; and
a fifth semiconductor region of the first conductivity type adjacent to the fourth semiconductor region and providing a source/drain region for the second FET;

wherein the integrated circuit further comprises a conductive member having a portion overlying the trench, wherein the conductive member provides a gate for the second FET;
wherein the first and second source/drain regions of the first FET and the channel region of the first FET curve around the trench.

15. The integrated circuit of claim 14 wherein the first and second semiconductor regions laterally surround the trench.

16. An integrated circuit comprising a first nonvolatile memory cell, the integrated circuit comprising:
a semiconductor substrate having a top surface and a trench formed in the top surface;
a dielectric on a surface of the trench;
a conductive floating gate at least partially located in the trench;
wherein the first nonvolatile memory cell comprises a first field effect transistor (FET) whose conductivity is at least partially controlled by the floating gate, and comprises a second FET for controlling access to the first FET;

wherein the substrate comprises:
a first semiconductor region of a first conductivity type adjacent to the trench and providing a first source/drain region for the first FET;
a second semiconductor region of a second conductivity type adjacent to the trench above the first semiconductor region and providing a channel region for the first FET;
a third semiconductor region of the first conductivity type, wherein at least a portion of the third semiconductor region lies adjacent to the trench above the second semiconductor region and provides a second source/drain region for the first FET, wherein the third semiconductor region also provides a source/drain region for the second FET;
a fourth semiconductor region of the second conductivity type adjacent to the third semiconductor region and providing a channel region for the second FET; and
a fifth semiconductor region of the first conductivity type adjacent to the fourth semiconductor region and providing a source/drain region for the second FET;

wherein the integrated circuit further comprises:
a conductive member having a portion overlying the trench, wherein the conductive member provides a gate for the second FET; and
a dielectric region having at least a portion extending below the top surface of the substrate between the trench and a top part of the third semiconductor region, wherein the third semiconductor region has a part located below said portion of the dielectric region and meeting the trench.

17. The integrated circuit of claim 16 wherein the dielectric region has a portion extending below the top surface of the substrate and overlapping the trench.

18. An integrated circuit comprising a first nonvolatile memory cell, the integrated circuit comprising:
a semiconductor substrate having a top surface and a trench formed in the top surface;
a dielectric on a surface of the trench;
a conductive floating gate at least partially located in the trench;
wherein the first nonvolatile memory cell comprises a first field effect transistor (FET) whose conductivity is at least partially controlled by the floating gate, and comprises a second FET for controlling access to the first FET;

wherein the substrate comprises:
  a first semiconductor region of a first conductivity type adjacent to the trench and providing a first source/drain region for the first FET;
  a second semiconductor region of a second conductivity type adjacent to the trench above the first semiconductor region and providing a channel region for the first FET;
  a third semiconductor region of the first conductivity type, wherein at least a portion of the third semiconductor region lies adjacent to the trench above the second semiconductor region and provides a second source/drain region for the first FET, wherein the third semiconductor region also provides a source/drain region for the second FET;
  a fourth semiconductor region of the second conductivity type adjacent to the third semiconductor region and providing a channel region for the second FET; and
  a fifth semiconductor region of the first conductivity type adjacent to the fourth semiconductor region and providing a source/drain region for the second FET;

wherein the integrated circuit further comprises a conductive member having a portion overlying the trench, wherein the conductive member provides a gate for the second FET;

wherein the integrated circuit comprises a plurality of nonvolatile memory cells, the first nonvolatile memory cell being one of the plurality;

wherein the semiconductor substrate comprises, for each cell, a trench formed in the top surface of the substrate;

wherein the integrated circuit comprises, for each cell, a dielectric on the surface of the respective trench and a floating gate at least partially located in the respective trench;

wherein each cell comprises a respective first FET whose conductivity is at least partially controlled by the respective floating gate, and comprises a respective second FET for controlling access to the respective first FET;

wherein the substrate comprises, for each cell:
  a first semiconductor region of a first conductivity type adjacent to the respective trench and providing a first source/drain region for the first FET of the cell;
  a second semiconductor region of a second conductivity type adjacent to the respective trench above the respective first semiconductor region and providing a channel region for the first FET of the cell;
  a third semiconductor region of the first conductivity type, wherein at least a portion of the third semiconductor, region lies adjacent to the respective trench above the respective second semiconductor region and provides a second source/drain region for the first FET of the cell, wherein the third semiconductor region also provides a source/drain region for the second FET of the cell;
  a fourth semiconductor region of the second conductivity type adjacent to the respective third semiconductor region and providing a channel region for the second FET of the cell; and
  a fifth semiconductor region of the first conductivity type adjacent to the respective fourth semiconductor region and providing a source/drain region for the second FET of the cell;

wherein the integrated circuit further comprises a plurality of wordlines, each wordline being for selecting a subset of the memory cells, wherein each wordline has portions overlying the trenches of the corresponding subset of the memory cells and provides gates for the second FETs of the corresponding subset of the memory cells, said conductive member being one of the wordlines.

19. The integrated circuit of claim 18 wherein said portions of each wordline overlie the floating gates of the corresponding subset of the memory cells.

20. The integrated circuit of claim 18 wherein the plurality of wordlines comprises a plurality of pairs of adjacent wordlines, wherein for each pair of wordlines, a memory cell corresponding to one of the wordlines and a memory cell corresponding to the other one of the wordlines have their fifth semiconductor regions merged together.

21. The integrated circuit of claim 14 wherein the memory cells form an array of rows and columns, each wordline being for selecting one row, wherein the rows are a plurality of pairs of adjacent rows, and in each pair of rows, the memory cells in each column have their fifth semiconductor regions merged together.

22. The integrated circuit of claim 17 wherein in each column of the memory cells, all of the third, fourth and fifth semiconductor regions are entirely located on one side of an area occupied by the trenches.

23. An integrated circuit comprising a nonvolatile memory cell, the integrated circuit comprising:
  a semiconductor substrate having a top surface and a first trench formed in the top surface;
  a dielectric on a surface of the first trench;
  a conductive floating gate at least partially located in the first trench;
  wherein the nonvolatile memory cell comprises a first field effect transistor (FET) whose conductivity is at least partially controlled by the floating gate;
  wherein the substrate comprises:
    a first semiconductor region of a first conductivity type adjacent to the first trench and providing a first source/drain region for the first FET;
    a second semiconductor region of a second conductivity type adjacent to the first trench above the first semiconductor region and providing a channel region for the first FET;
    a third semiconductor region of the first conductivity type, wherein at least a portion of the third semiconductor region lies adjacent to the first trench above the second semiconductor region and provides a second source/drain region for the first FET;
  wherein the integrated circuit further comprises a dielectric region having at least a portion extending below the top surface of the substrate between the first trench and a top part of the third semiconductor region, wherein the third semiconductor region has a part located below said portion of the dielectric region and meeting the first trench.

24. The integrated circuit of claim 23 wherein the dielectric region has a portion extending below the top surface of the substrate and overlapping the first trench.

25. The integrated circuit of claim 23 wherein the nonvolatile memory cell comprises a second FET for controlling access to the first FET;
  wherein the third semiconductor region provides a source/drain region for the second FET;

wherein the substrate comprises:
  a fourth semiconductor region of the second conductivity type adjacent to the third semiconductor region and providing a channel region for the second FET; and
  a fifth semiconductor region of the first conductivity type adjacent to the fourth semiconductor region and providing a source/drain region for the second FET;
wherein the integrated circuit further comprises a conductive gate for the second FET.

26. The integrated circuit of claim 23 wherein the dielectric on the surface of the first trench is stronger against leakage adjacent at least a portion of the first semiconductor region than adjacent at least a portion of the second semiconductor region.

27. The integrated circuit of claim 26 wherein a stronger portion of the dielectric adjacent at least the portion of the first semiconductor region comprises silicon nitride, and a less strong portion of the dielectric adjacent at least the portion of the second semiconductor region consists of silicon oxide.

28. The integrated circuit of claim 23 wherein all of the floating gate is in the first trench.

29. The integrated circuit of claim 28 wherein the floating gate is below the top surface of the semiconductor substrate.

* * * * *

UNITED STATES PATENT AND TRADEMARK OFFICE
CERTIFICATE OF CORRECTION

| | | |
|---|---|---|
| PATENT NO. | : 7,057,231 B2 | Page 1 of 1 |
| APPLICATION NO. | : 10/847850 | |
| DATED | : June 6, 2006 | |
| INVENTOR(S) | : Ding et al. | |

It is certified that error appears in the above-identified patent and that said Letters Patent is hereby corrected as shown below:

On the title page,

[*] Notice:   Subject to any disclaimer, the term of this patent is extended or adjusted under 35 USC 154(b) by (0) days Delete the phrase "by 0" and insert -- by 84 days--

Signed and Sealed this

Twenty-ninth Day of May, 2007

JON W. DUDAS
*Director of the United States Patent and Trademark Office*